(12) United States Patent
Reynolds et al.

(10) Patent No.: US 9,804,213 B2
(45) Date of Patent: Oct. 31, 2017

(54) CAPACITIVE SENSOR DEVICE

(75) Inventors: Joseph Kurth Reynolds, Mountain View, CA (US); Kirk Hargreaves, Sunnyvale, CA (US); Shahrooz Shahparnia, Campbell, CA (US); Phillip Acker, San Mateo, CA (US)

(73) Assignee: Synaptics Incorporated, San Jose, CA (US)

( * ) Notice: Subject to any disclaimer, the term of this patent is extended or adjusted under 35 U.S.C. 154(b) by 2202 days.

(21) Appl. No.: 12/778,940

(22) Filed: May 12, 2010

(65) Prior Publication Data

US 2010/0292945 A1 Nov. 18, 2010

Related U.S. Application Data

(60) Provisional application No. 61/224,814, filed on Jul. 10, 2009, provisional application No. 61/177,897, filed on May 13, 2009.

(51) Int. Cl.
*G01R 27/00* (2006.01)
*G01R 27/26* (2006.01)
(Continued)

(52) U.S. Cl.
CPC ......... *G01R 27/2605* (2013.01); *G06F 3/044* (2013.01); *G06F 3/0416* (2013.01);
(Continued)

(58) Field of Classification Search
CPC ........ G06F 3/0416; G06F 3/044; G06F 19/00; H03K 17/9622; H03K 17/955;
(Continued)

(56) References Cited

U.S. PATENT DOCUMENTS 5,841,078 A 11/1998 Miller et al.
5,945,980 A 8/1999 Moissev et al.
(Continued)

FOREIGN PATENT DOCUMENTS

CN 87102580 A 12/1987
CN 1038342 A 12/1989
(Continued)

OTHER PUBLICATIONS

ISA/KR, International Search Report and Written Opinion for International Application No. PCT/US2010/034608, 15 pages, dated Dec. 29, 2010 (Oct. 29, 2010).
(Continued)

*Primary Examiner* — Arleen M Vazquez
*Assistant Examiner* — Brent J Andrews
(74) *Attorney, Agent, or Firm* — Osha Liang LLP

(57) ABSTRACT

A capacitive sensor device comprises a first sensor electrode, a second sensor electrode, and a processing system coupled to the first sensor electrode and the second sensor electrode. The processing system is configured to acquire a first capacitive measurement by emitting and receiving a first electrical signal with the first sensor electrode. The processing system is configured to acquire a second capacitive measurement by emitting and receiving a second electrical signal, wherein one of the first and second sensor electrodes performs the emitting and the other of the first and second sensor electrodes performs the receiving, and wherein the first and second capacitive measurements are non-degenerate. The processing system is configured to determine positional information using the first and second capacitive measurements.

20 Claims, 22 Drawing Sheets

(51) Int. Cl.
*G06F 3/044* (2006.01)
*G06F 3/041* (2006.01)
*H03K 17/955* (2006.01)
*H03K 17/96* (2006.01)

(52) U.S. Cl.
CPC ....... *H03K 17/955* (2013.01); *H03K 17/9622* (2013.01); *H03K 2217/96073* (2013.01); *H03K 2217/960725* (2013.01); *H03K 2217/960765* (2013.01); *H04M 2250/12* (2013.01)

(58) Field of Classification Search
CPC ...... H03K 2217/960725; H03K 2217/960765; H03K 2217/96073; H04M 2250/12; G01R 27/2605; G01R 27/00; G01R 27/26
USPC .......................... 324/658–690; 345/173–174
See application file for complete search history.

(56) References Cited

U.S. PATENT DOCUMENTS

| | | | |
|---|---|---|---|
| 6,166,583 A | 12/2000 | Kochi et al. | |
| 6,239,788 B1 | 5/2001 | Nohno et al. | |
| 6,452,514 B1 | 9/2002 | Phillip | |
| 7,151,528 B2 | 12/2006 | Taylor et al. | |
| 7,288,946 B2 | 10/2007 | Hargreaves et al. | |
| 7,521,942 B2 | 4/2009 | Reynolds | |
| 7,649,524 B2 | 1/2010 | Haim et al. | |
| 7,911,456 B2 | 3/2011 | Gillespie et al. | |
| 7,920,129 B2 | 4/2011 | Hotelling et al. | |
| 8,054,300 B2 | 11/2011 | Bernstein | |
| 8,217,915 B2 | 7/2012 | Philipp | |
| 8,259,076 B2 | 9/2012 | Trent, Jr. et al. | |
| 8,462,135 B1 | 6/2013 | Xiao et al. | |
| 2003/0025679 A1 | 2/2003 | Taylor et al. | |
| 2005/0052429 A1 | 3/2005 | Philipp | |
| 2005/0134292 A1 | 6/2005 | Knoedgen | |
| 2005/0156881 A1* | 7/2005 | Trent et al. | 345/157 |
| 2006/0097991 A1 | 5/2006 | Hotelling et al. | |
| 2006/0244733 A1 | 11/2006 | Geaghan | |
| 2007/0074914 A1 | 4/2007 | Geaghan et al. | |
| 2007/0075710 A1 | 4/2007 | Hargreaves et al. | |
| 2007/0247443 A1* | 10/2007 | Philipp | 345/173 |
| 2008/0042661 A1* | 2/2008 | Reynolds | 324/688 |
| 2008/0048997 A1* | 2/2008 | Gillespie et al. | 345/174 |
| 2008/0061800 A1 | 3/2008 | Reynolds et al. | |
| 2008/0150906 A1 | 6/2008 | Grivna | |
| 2008/0157782 A1 | 7/2008 | Krah | |
| 2008/0158172 A1 | 7/2008 | Hotelling et al. | |
| 2008/0158183 A1* | 7/2008 | Hotelling et al. | 345/173 |
| 2008/0162996 A1 | 7/2008 | Krah et al. | |
| 2008/0162997 A1 | 7/2008 | Vu et al. | |
| 2008/0278453 A1 | 11/2008 | Reynolds et al. | |
| 2009/0033343 A1 | 2/2009 | Reynolds et al. | |
| 2009/0107737 A1 | 4/2009 | Reynolds et al. | |
| 2009/0273579 A1 | 11/2009 | Zachut et al. | |
| 2009/0284495 A1 | 11/2009 | Geaghan et al. | |
| 2010/0001973 A1 | 1/2010 | Hotelling et al. | |
| 2010/0060608 A1 | 3/2010 | Yousefpor | |
| 2010/0149110 A1 | 6/2010 | Gray | |
| 2010/0164889 A1 | 7/2010 | Hristov et al. | |
| 2010/0245286 A1 | 9/2010 | Parker | |
| 2011/0006832 A1 | 1/2011 | Land et al. | |
| 2012/0043971 A1 | 2/2012 | Maharyta | |
| 2012/0081335 A1 | 4/2012 | Land et al. | |
| 2012/0113047 A1 | 5/2012 | Hanauer et al. | |

FOREIGN PATENT DOCUMENTS

| | | |
|---|---|---|
| CN | 1039301 A | 1/1990 |
| CN | 1044528 A | 8/1990 |
| CN | 1603846 A | 4/2005 |
| CN | 1945387 A | 4/2007 |
| CN | 1971352 A | 5/2007 |
| CN | 101014879 A | 8/2007 |
| CN | 101339313 A | 1/2009 |
| EP | 2300899 A2 | 3/2011 |
| EP | 2291729 B1 | 6/2013 |
| JP | 10505182 A | 5/1998 |
| JP | 2005-017216 A | 1/2005 |
| JP | 2007533044 A | 11/2007 |
| WO | 2005019766 A2 | 3/2005 |
| WO | 2005114369 A2 | 12/2005 |
| WO | 2006127466 A2 | 11/2006 |
| WO | 2006132960 A1 | 12/2006 |
| WO | 2009058359 A1 | 5/2009 |
| WO | 2009140347 A2 | 11/2009 |

OTHER PUBLICATIONS

Office Action, CN Application No. 201080021037.2, 15 pages, dated Aug. 4, 2014 (Aug. 4, 2014).
Office Action issued in Chinese Patent Application No. 201510761851.2 dated Apr. 21, 2017 (36 pages).
Leineweber, Hubert, Extended Search Report for European Application No. 10 77 5499, 22 pages, dated May 22, 2014 (May 22, 2014).
Rekimoto, "SmartSkin: An Infrastructure for Freehand Manipulation on Interactive Surfaces", Proceedings of the SIGCHI conference on Human factors in computing systems: Changing our world, changing ourselves, Apr. 20-25, 2002, 113-120.
Office Action Search Report, CN Application No. 201080021037.2, 2 pages, dated Nov. 27, 2013 (Nov. 27, 2013).
Yasuhiro Tagawa, Office Action for Japanese Application No. 2012-510991, 2 pages, dated Jan. 28, 2014 (Jan. 28, 2014).
Office Action, U.S. Appl. No. 14/156,906, dated Apr. 14, 2014, 27 pages.
Office Action for JP Application No. 2014-232889, dated Oct. 20, 2015, 4 Pages.
Office Action, CN Application No. 201080021037.2, 35 pages, dated Feb. 16, 2015 (Feb. 16, 2015).
Office Action Search Report for CN Application No. 201410157610.2, dated Dec. 16, 2015, 3 Pages.
Office Action in counterpart Chinese Patent Application No. 201510761853.1 dated May 22, 2017 (5 pages).

* cited by examiner

| | (I) Input Object | ($S_1$) Sensor Electrode 1 | ($S_2$) Sensor Electrode 2 | Approximate $V_{OUT}$ |
|---|---|---|---|---|
| Guarded absolute | — | ⊓⊔⊓⊔ | ⊓⊔⊓⊔ | $(C_{E2})(\Delta V_{E2})/C_I$ |
| Grounded absolute | — | — | ⊓⊔⊓⊔ | $(C_{12}+C_{E2})\Delta V_{E2}/C_I$ |
| Shielded transcapacitance | — | ⊓⊔⊓⊔ | — | $(C_{12})(\Delta V_{12})/C_I$ |
| Mixed Absolute/ Trans Capacitance | — | ⊓⊔⊓⊔ | ⊓⊔⊓⊔ | $(C_{E2}-2C_{12})(\Delta V_{E2})/C_I$ |

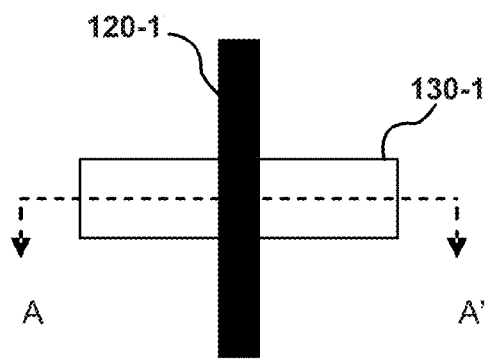
Fig. 5A
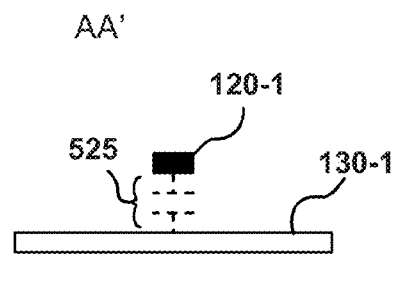
Fig. 5B
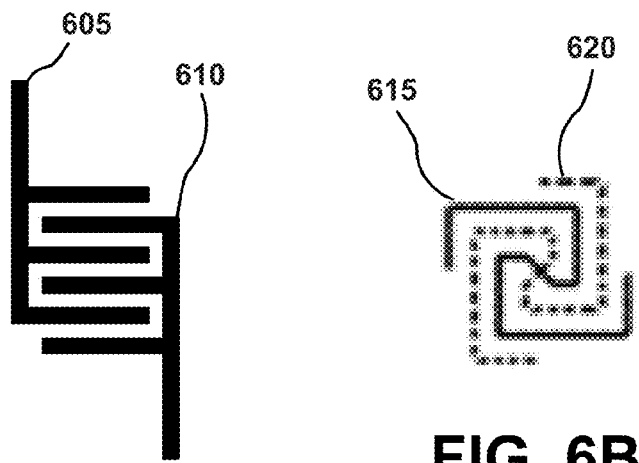
FIG. 6B
FIG. 6A
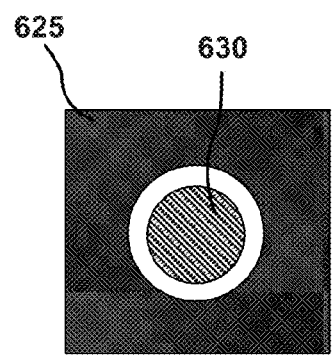
FIG. 6C

900

```
┌─────────────────────────────────────────────────────────────┐
│ Emits and receives a first electrical signal with the first │
│ sensor electrode to acquire a first capacitive measurement. │
│                             905                             │
└─────────────────────────────────────────────────────────────┘
                               │
                               ▼
┌─────────────────────────────────────────────────────────────┐
│ Emits and receives a second electrical signal to acquire a  │
│ second capacitive measurement, wherein one of the first and │
│ second sensor electrodes performs the emitting and the      │
│ other of the first and second sensor electrodes performs    │
│ the receiving, wherein the first and second capacitive      │
│ measurements are non-degenerate.                            │
│                             910                             │
└─────────────────────────────────────────────────────────────┘
                               │
                               ▼
┌─────────────────────────────────────────────────────────────┐
│ Determines positional information using the first and       │
│ second capacitive measurements.                             │
│                             915                             │
└─────────────────────────────────────────────────────────────┘
```

Emits electrical signals from a first set of the first plurality of sensor electrodes.
1105

Receives the electrical signals from the first set of the first plurality of sensor electrodes with a second set of the first plurality of sensor electrodes to acquire a first plurality of capacitive measurements.
1110

Emits electrical signals from the second set of the first plurality of sensor electrodes, wherein the first and second sets of the first plurality of sensor electrodes have at least one sensor electrode in common.
1115

Receives second electrical signals from the second set of the first plurality of sensor electrodes with a first set of the second plurality of sensor electrodes to acquire a second plurality of capacitive measurements.
1120

```
Emits and receives first electrical signals with the first plurality of
sensor electrodes to acquire a first plurality of capacitive
measurements.
1405
```
↓
```
Makes a set of first estimates of positions of at least one input
object using the first plurality of capacitive measurements.
1410
```
↓
```
Determines a first set of the first plurality of sensor electrodes and
a first set of the second plurality of sensor electrodes using the
first set of estimates of said positions.
1415
```
↓
```
Emits second electrical signals with one of the first and second
sets and receives the second electrical signals with the other of
the first and second sets to acquire a second plurality of capacitive
measurements.
1420
```
↓
```
Makes a second estimate of the position of the at least one input
object using the second plurality of capacitive measurements.
1425
```

FIG. 14

CAPACITIVE SENSOR DEVICE

CROSS REFERENCE TO RELATED APPLICATIONS

This application claims priority to and benefit of U.S. Provisional Patent Application No. 61/224,814 filed Jul. 10, 2009, which claims the benefit of U.S. Provisional Patent Application No. 61/177,897 filed May 13, 2009, both of which are hereby incorporated by reference in their entirety herein.

BACKGROUND

Capacitive sensing devices are widely used in modern electronic devices. For example, capacitive sensing devices have been employed in music and other media players, cell phones and other communications devices, remote controls, personal digital assistants (PDAs), and the like. These capacitive sensing devices are often used for touch based navigation, selection, or other functions. These functions can be in response to one or more fingers, styli, other objects, or combination thereof providing input in the sensing regions of respective capacitive sensing devices. However, there exist many limitations to the current state of technology with respect to capacitive sensing devices.

BRIEF DESCRIPTION OF THE DRAWINGS

The accompanying drawings, which are incorporated in and form a part of this specification, illustrate embodiments of the technology for a capacitive sensor device and, together with the description, serve to explain principles discussed below. The drawings referred to in this brief description should not be understood as being drawn to scale unless specifically noted.

FIG. 4 shows several non-limiting modulation examples, in accordance with embodiments of the present technology FIGS. 5A and 5B show a top view and a side view, respectively, of an example sensor electrode pattern, in accordance with embodiments of the present technology.

FIGS. 6A, 6B and 6C show a top view of example sensor electrode patterns, in accordance with embodiments of the present technology.

FIG. 9 is flowchart of an example method of determining positional information using a capacitive sensor device comprising a first sensor electrode and a second sensor electrode, in accordance with embodiments of the present technology.

FIG. 11 is flowchart of an example method of sensing using a capacitive sensor device comprising a first plurality of sensor electrodes aligned along a first axis and a second plurality of sensor electrodes aligned along a second axis non-parallel to the first axis, in accordance with embodiments of the present technology.

FIG. 14 is flowchart of an example method of sensing using a capacitive sensor device comprising a first plurality of sensor electrodes aligned along a first axis and a second plurality of sensor electrodes aligned along a second axis non-parallel to the first axis, in accordance with embodiments of the present technology.

DESCRIPTION OF EMBODIMENTS

Reference will now be made in detail to embodiments of the present technology, examples of which are illustrated in the accompanying drawings. While the present technology will be described in conjunction with embodiments, it will be understood that the descriptions are not intended to limit the present technology to these embodiments. On the contrary, the descriptions are intended to cover alternatives, modifications and equivalents, which may be included within the spirit and scope as defined by the appended claims. Furthermore, in the following detailed description, numerous specific details are set forth in order to provide a thorough understanding of embodiments of the present technology. However, one of ordinary skill in the art will understand that embodiments of the present technology may be practiced without these specific details. In other instances, well known methods, procedures, components, and circuits have not been described in detail as not to unnecessarily obscure aspects of the present technology.

Overview of Discussion

The discussion will begin with description of an example capacitive sensor device with which or upon which various embodiments described herein may be implemented. The discussion will then turn to an explanation of the terminology associated with the capacitive sensor device in accordance with embodiments of the present technology. Discussions of grounding, noise, and types of capacitance will be presented. A discussion of example capacitive sensor electrodes and sensor arrays will be presented; the discussion will include description of some techniques and situations for performing both absolute and transcapacitive sensing with the same sensor device and for disambiguation through transcapacitive sensing. The discussion will then be followed by a detailed description focusing on aspects of the structure of various example capacitive sensing devices and various example conceptual and circuit diagrams that are discussed with a view toward use and operation of embodiments described herein.

Figure 1:
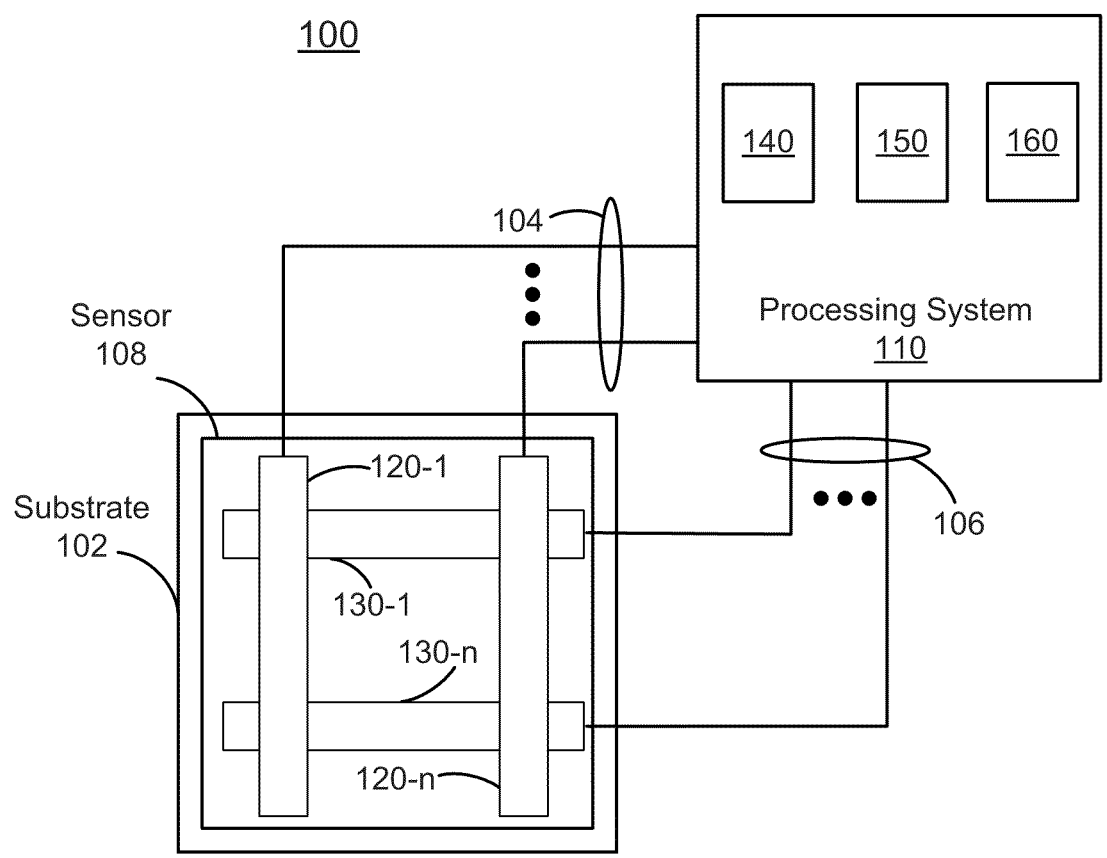
FIG. 1 is a plan view block diagram of an example capacitive sensor device that can be implemented to include one or more embodiments of the invention.

Some capacitive sensing devices may be configured to acquire electret unmodulated capacitive measurements (may be referred to as electret sensing or sensors). However, these measurements are typically not used by touch input devices for sensing touch input. Electret sensing requires a difference in voltage (or a trapped charge) which can induce currents (or charge) as the object moves toward the sensor. Because the voltage is difficult to control on an external object, this method is not typically used. Also, since electret capacitive measurements are fundamentally DC they can not be demodulated and made narrow band sensors. Electret capacitive measurements are not performed by the embodiments described herein Example Capacitive Sensing Device FIG. 1 is a plan view block diagram of an example capacitive sensor device 100 that can be implemented to include one or more embodiments of the present invention. As illustrated, capacitive sensor device 100 includes a sensor 108 that is disposed on a substrate 102. Sensor 108 includes two pluralities of sensor electrodes 120, 130. Although only two sensor electrodes are illustrated in each plurality (120, 130), it is appreciated that either or both can include more than two sensor electrodes. Although not illustrated, in some embodiments there may be only a single sensor electrode 120-1 and a plurality of sensor electrodes 130-1 to 130-$n$, or plurality of sensor electrodes 120-1 to 120-$n$ and a single sensor electrode 130-1. Likewise, while not illustrated, in some embodiments, there may be only a single sensor electrode 120-1 and a single sensor electrode 130-1. It is also appreciated that sensor electrodes 120 and sensor electrodes 130 are separated by a dielectric layer (not shown). In some embodiments, plurality of sensor electrodes 120 and plurality of sensor electrodes 130 may be disposed on separate substrates and the substrates may be joined together before operation.

As illustrated, sensor electrodes 120, 130 are coupled to processing system 110 by conductive routing traces 104, 106. For ease of illustration and description, sensor 108 is shown with sensor electrodes 120, 130 arranged in an x/y grid, which creates capacitive pixels where capacitive coupling is measured between sensor intersections. It is appreciated, that the discussion herein is not limited to such an arrangement of sensor 108, but is instead applicable to numerous sensor electrode patterns, some of which are illustrated herein by way of example and not of limitation.

Capacitive sensor device 100 can be utilized to communicate user input (e.g., using a user's finger, a probe such as a stylus, and/or some other external input object) to a computing device or other electronic device. For example, capacitive sensor device 100 can be implemented as a capacitive touch screen device that can, in some embodiments, be placed over an underlying image or an information display device (not shown). In this manner, a user would view the underlying image or information display by looking through the substantially transparent sensor electrodes (not illustrated) in sensor 108 of capacitive sensor device 100 as shown. It is noted that one or more embodiments, in accordance with the present invention, can be incorporated with a capacitive touch screen device similar to that of capacitive sensor device 100.

When in operation, sensor 108 is used to form a "sensing region" for sensing inputs. It is appreciated that sensor 108 typically comprises a plurality of sensor elements (e.g., the intersections of sensor electrodes 120 and 130) arranged as a sensor array to form sensor 108. Sensing regions are discussed in more detail below.

Capacitive sensor device 100, when implemented as a touch screen, can include a substantially transparent substrate 102 (or a plurality of substantially transparent substrates) having a first set of conductive routing traces 104 and a second set of conductive routing traces 106 patterned (or formed) coupled thereto. Conductive routing traces 104 and/or 106 can be utilized for coupling processing system 110 with sensor electrodes (120, 130), arrays of sensor electrodes, and/or conductive traces that form a sensor 108. Although sensor 108 is depicted as rectangular, other shapes, such as circular are anticipated. Sensor electrodes 120, 130 of sensor 108 can be formed of a substantially transparent conductive material. Indium tin oxide (ITO) and/or thin, barely visible wires are but two of many possible examples of a substantially transparent conductive material that can be used to form one or more sensor electrodes 120, 130 or conductive traces of sensor 108.

Processing system 110 drives sensor electrode(s) with a voltage and senses resulting respective charge on sensor electrode(s), to acquire one or more measurements of capacitance with respect to sensor 108. Additionally, or alternatively in some embodiments, processing system 110 may drive charge on sensor electrode(s) and measure resulting voltage on sensor electrode(s). Sensor electrode controller 140, in one embodiment, is used by processing system 110 to selectively drive signal(s) on one or more sensor electrodes and to selectively receive signal(s) on one or more sensor electrodes.

In some embodiments capacitive measurer 150 performs capacitance measurements (which may be measurements of absolute capacitance or transcapacitance) based upon received signals. For example, in some embodiments, processing system 110 makes and utilizes a plurality of capacitive measurements, associated with individual sensor elements (e.g., the intersections of sensor electrodes 120, 130) of sensor 108, as pixels to create a "capacitive image." In this manner, processing system 110 can capture a capacitive image that is a snapshot of the response measured in relation to an input object or objects in the sensing region of sensor 108. Capacitive pixels, images, absolute capacitance, and transcapacitance are discussed further below.

Such measurement(s) of capacitance by processing system 110 enable the sensing of contact, hovering, or other user input with respect to the sensing region formed by sensor 108. In some embodiments, such measurement(s) are utilized by position, size, and/or type "determiner" 160, of processing system 110, to determine positional information with respect to a user input relative to the sensing region formed by sensor 108. Such measurement(s) can additionally or alternatively be utilized by determiner 160, in some embodiments, to determine input object size and/or input object type.

Processing system 110 may be implemented as one or more integrated circuits and/or discrete components. In one embodiment, processing system 110 includes or is implemented within an application specific integrated circuit (ASIC). In accordance with the embodiments described herein, such an ASIC can include components such as: sensor electrode controller 140; capacitive coupling measurer 150; "determiner" 160; and/or embedded logic instructions. The embedded logic instructions may be for, but are not limited to, performing such functions as: transmitting and/or receiving on selected sensor electrodes; performing capacitance measurements); and determining contact, position, type, and/or size information with respect an input object interacting with a sensing region of sensor 108.

Although described above with respect to a touch screen, capacitive sensor device 100 can also be implemented as a capacitive touchpad, slider, button or other capacitance sensor. For example, substrate 102 of capacitive sensor device 100 can be implemented with, but is not limited to, one or more clear or opaque materials that are utilized as a substrate for a capacitance sensor. Likewise, clear or opaque conductive materials can also be utilized to form sensor electrodes in sensor 108.

Terminology

The positional information determined by processing system 110 can be any suitable indicia of object presence. For example, the processing system can be implemented to determine "zero-dimensional" 1-bit positional information (e.g., near/far or contact/no contact) or "one-dimensional" positional information as a scalar (e.g., position or motion along a sensing region). Processing system 110 can also be implemented to determine multi-dimensional positional information as a combination of values (e.g., two-dimensional horizontal/vertical axes, three-dimensional horizontal/vertical/depth axes, angular/radial axes, or any other combination of axes that span multiple dimensions), and the like. Processing system 110 can also be implemented to determine information about time or history.

Furthermore, the term "positional information" as used herein is intended to broadly encompass absolute and relative position-type information, and also other types of spatial-domain information such as velocity, acceleration, and the like, including measurement of motion in one or more directions. Various forms of positional information may also include time history components, as in the case of gesture recognition and the like. The positional information from the processing system 110 facilitates a full range of interface inputs, including use of the proximity sensor device as a pointing device for cursor control, scrolling, and other functions.

As previously described, a capacitive sensor device, such as device 100 includes a sensing region. The capacitance sensing device is sensitive to input by one or more input objects (e.g., fingers, styli, etc.), such as the position of an input object within the sensing region. "Sensing region" as used herein is intended to broadly encompass any space above, around, in and/or near the input device in which sensor(s) of the input device is able to detect user input. In a conventional embodiment, the sensing region of an input device extends from a surface of the sensor of the input device in one or more directions into space until signal-to-noise ratios prevent sufficiently accurate object detection.

The distance to which this sensing region extends in a particular direction may be on the order of less than a millimeter, millimeters, centimeters, or more, and may vary significantly with the type of sensing technology used and the accuracy desired. Thus, embodiments may require contact with the surface, either with or without applied pressure, while others do not. Accordingly, the sizes, shapes, and locations of particular sensing regions may vary widely from embodiment to embodiment.

Sensing regions with rectangular two-dimensional projected shapes are common, and many other shapes are possible. For example, depending on the design of the sensor array and surrounding circuitry, shielding from any input objects, and the like, sensing regions may be made to have two-dimensional projections of other shapes. Similar approaches may be used to define the three-dimensional shape of the sensing region. Input objects in the sensing region may interact with the transcapacitance sensing apparatus.

For example, sensor electrodes (e.g., 120, 130) of an input device, such as capacitive sensing device 100, may use arrays or other patterns of sensor electrodes to support any number of sensing regions. As another example, the sensor electrodes may use capacitive sensing technology in combination with resistive sensing technology to support the same sensing region or different sensing regions. Examples of the types of technologies that may be used to implement the various embodiments of the invention may be found in U.S. Pat. Nos. 5,543,591, 5,648,642, 5,815,091, 5,841,078, and 6,249,234.

With continued reference to FIG. 1, various embodiments can utilize transcapacitive sensing methods based on the capacitive coupling between sensor electrodes (120, 130). Transcapacitive sensing methods are sometimes also referred to as "mutual capacitance sensing methods." In one embodiment, a transcapacitive sensing method operates by detecting the electric field coupling one or more transmitter sensor electrodes (which are transmitting a signal) with one or more receiver sensor electrodes. Proximate objects may cause changes in the electric field, and produce detectable changes in the transcapacitive coupling. As previously described, sensor electrodes may transmit as well as receive, either simultaneously or in a time multiplexed manner. Sensor electrodes that transmit (e.g., sensor electrodes 130) are sometimes referred to as the "transmitting sensor electrodes," "driving sensor electrodes," "transmitters," or "drivers"—at least for the duration when they are transmitting. Other names may also be used, including contractions or combinations of the earlier names (e.g., "driving electrodes" and "driver electrodes." Sensor electrodes that receive (e.g., sensor electrodes 120) are sometimes referred to as "receiving sensor electrodes," "receiver electrodes," or "receivers"—at least for the duration when they are receiving. Similarly, other names may also be used, including contractions or combinations of the earlier names.

Transcapacitive sensing schemes may detect changes in capacitive coupling between transmitter sensor electrodes and receiver sensor electrodes when a separate electrode (e.g., an external input object such as a human digit or a stylus) is brought near. The output of sensor 108 when employing a transcapacitive sensing scheme is often referred to as an "image" or a "capacitive image." The capacitive image includes of a plurality of pixels. Pixels of a capacitive image can be referred to as the region in which the transcapacitive coupling between transmitting sensor electrode(s) 130 and receiving sensor electrode(s) 120 can be detected, a measurement location between a transmitting sensor electrode and a receiving sensor electrode, or a meeting region between transmitter sensor electrode(s) 130 and receiver sensor electrode(s) 120.

In this document, the term "electrically drive" may be used to indicate controlling some electrical aspect of the driven item. For example, it is possible to drive current through a wire, drive charge onto a conductor, drive a constant or varying voltage waveform onto an electrode, etc.

In this document, the term "electrically modulating" can include modulating any appropriate electrical characteristic of the signal, such as the current or voltage, the amplitude or phase (including sign), some combination thereof, and the like.

In this document, the term "transmit" or "transmitting" may be used to indicate release of electrical signals, and may imply intentional release of the signals. Transmitting may be done at a low impedance relative to the capacitive coupling to the receiver.

In this document, the term "sensor electrodes" may include electrodes that transmit or receive electrical indicia. Some embodiments of the invention include dedicated transmitting sensor electrodes, dedicated receiving sensor electrodes, or both. However, the same physical electrode may be used both to transmit and receive. Depending on the embodiment, the transmitting and receiving can be simultaneous or take place at different times.

Grounding

In this document, "system ground" (also often referred to as "chassis ground," "device ground," or "ground") may indicate a common voltage shared by the system components. For example, a capacitive sensing system of a mobile phone may, at times, be referenced to a system ground provided by the phone's power source (e.g., a charger or battery). In many systems, the system ground is connected to or provided by the largest area electrode in the system. Embodiments may situate or configure the system ground with elements farthest from any capacitive sensor electrode(s) used by the system.

The system ground may not be fixed relative to earth or any other reference. For example, the system grounds for cell phones may be provided by the respective battery grounds. A battery ground may differ from the earth ground of an electrical plug connected to the cell phone charger, the neutral of the charger, and other potential references. A cell phone on a table usually has a floating system ground. A cell phone being charged inductively, and thus with no direct connection to the charger ground, may have a system ground that varies with respect to earth ground. A cell phone being charged with a charger having a ground (e.g., USB ground, wall-socket ground) may still have a system ground that varies with earth ground, and components of the phone may not be referenced to earth ground (e.g., where the USB ground terminates in a laptop or where the laptop is floating relative to earth ground). A cell phone being held by a person who is strongly coupled to earth ground through free space may be grounded relative to the person; however, the person-ground may be varying relative to earth ground.

Something that has a voltage substantially constant with respect to system ground does not move in voltage (referenced to system ground) as the system ground's potential changes. For example, an input object may be substantially at system ground, and not move in voltage significantly as the system ground's potential changes.

Electrically, any voltage that is effectively fixed relative to the reference may be an effective alternative current (AC) ground, since it has no AC component. Thus, AC grounded items may not be electrically connected together or even to a same ground. Voltages that are substantially constant with respect to the reference (e.g., system ground) generally can also serve as AC grounds, and may be equivalent to each other in sensing/receiving AC capacitive signals. For example, from the perspective of a system referenced to system ground, an object at AC ground may be at a voltage substantially equal or constantly offset from system ground (at least within the bandwidth of the sensor). Such objects are effectively not electrically modulated significantly relative to system ground.

Items may be modulated outside of the sensing bandwidth of a capacitive sensing system and effectively be grounded with respect to the sensing system. Thus, objects near a sensor device may be modulated in a way that is not detectable or is filtered out by the sensor device. For example, an external object may be modulated at a very high frequency relative to the measurement bandwidth of a capacitance sensor device; from that sensor device's perspective, the external object may still be considered an AC ground. This is because, within the sensing regime, the modulation of the external object relative to system ground is small relative to the signals that the system is trying to detect.

As a specific example, a sensor device may be tuned not to detect (or to respond minimally) to 60 Hz modulation (e.g., main electricity modulation of fluorescent lights) and 2 GHz modulation (e.g., some phone signals). If the sensor system can average over enough samples, and has a bandwidth narrow enough to avoid the noise, then these out-of-band modulations do not effectively change the grounded status of these items.

Noise

Many sensing devices are made narrow band to ameliorate the effects of such "out-of-band noise." For absolute capacitance sensing (discussed below), this narrow band demodulation (or sampling) may be relative to the electrical modulation of the sensor electrode. For transcapacitance sensing (also discussed below), the narrow band demodulation may be relative to the electrical modulation of the transmitter. For the mixed absolute/trans case (discussed below), the narrow band demodulation may be relative to the electrical modulation of the receiver sensor electrode, and the transmitter which may be at the same frequency.

In various embodiments, the narrow band filtering may be done in the analog "front end" domain, the digital "back end" domain, or both. For example, a signal can be sampled at twice the modulation rate into two independent signals that are 90 degrees out of phase, and a digital filter can be used to decode/demodulate this signal. As another example, an I & Q system (where I is intensity and Q is quadrature) may be used to detect two different signals and distinguish the effects of each from the other. Other examples include coded demodulation, FIR/IIR (Finite Impulse Response/Infinite Impulse Response) filtering, and the like.

Types of Capacitive Measurements

Capacitive sensors and capacitive sensing devices detect capacitance because they are affected by changes in electric fields. Changes in the electric fields are related to how charge flows through the coupled capacitance(s). Thus, embodiments of capacitive sensors in accordance with the present technology may use voltage changes, current flow, charge accumulation, etc. to acquire capacitive measurements.

"Absolute capacitance" or "absolute capacitive coupling" may be used to indicate capacitive coupling to system ground. In practice, a sensor electrode that is electrically modulated relative to system ground may be used to detect absolute capacitance. Sometimes, the capacitive measurement obtained by the sensor electrode may not be pure absolute capacitance (e.g., when a nearby transmitting sensor electrode is modulated relative to system ground and the sensor electrode, a transcapacitance may also be introduced). However, absolute capacitance may dominate in the capacitive measurement if objects near the sensor electrode are effectively held at "AC ground" from the perspective of the system ground. In many cases, objects near the sensor electrode may include external object(s) to be sensed and other electrodes. The external object(s) and other electrodes may or may not be part of the sensing device or electronic system.

In many embodiments, absolute capacitance may also dominate in the capacitive measurement if any nearby objects that are not substantially constant with respect to system ground, other than the external object(s) to be sensed, are electrically modulated in substantially the same way as the sensor electrode. This may be because identically-modulated other objects do not affect the voltage on the sensor electrode, and do not transfer charge to the sensor electrode. In some embodiments, these identically-modulated nearby objects may help guard and shield the sensor electrode from electronic effects.

However, typically, a capacitance measurement may not be purely of absolute capacitance, since grounding may not be perfect, modulation may not be completely identical (and guarding may not be perfect). In some embodiments, the measurement may still be close enough to a measurement of pure absolute capacitance to be treated as such. In other embodiments, the measurement may be used with one or more other measurements to derive the absolute capacitance portion. Thus, it would be possible to measure and calculate the amount of charge that would have been transferred in an ideal absolute capacitive implement.

"Transcapacitance" or "transcapacitive coupling" may be used to indicate capacitive coupling to one or more transmitting sensor electrodes modulated relative to system ground. In practice, sensor electrodes may be used in groups of two or more to sense transcapacitance. One or more sensor electrodes of the group transmit electrical signals while one or more sensor electrodes of the group receive the transmitted electrical signals. For example, transcapacitance may be detected where a transmitting sensor electrode electrically modulated relative to system ground emits electrical signals that are received by a receiving sensor electrode that may not be electrically modulated relative to system ground.

Transcapacitance may dominate in the capacitive measurement where all objects near the transmitting or receiving sensor electrodes are substantially constant relative to system ground. That is, these nearby objects may not be electrically modulated relative to system ground. In such a case, these nearby objects may also function as guards that help to prevent noise from reaching the receiving sensor electrode. A nearby object may also guard the transmitter sensor electrode from the receiver sensor electrode, reducing the capacitive coupling and changing the transcapacitive measurement.

In some embodiments, a sensor electrode (120, 130) can simultaneously transmit and receive; this type of simultaneous transmission and reception may result in a capacitance measurement that includes both absolute capacitance and transcapacitance portions.

Figure 2:
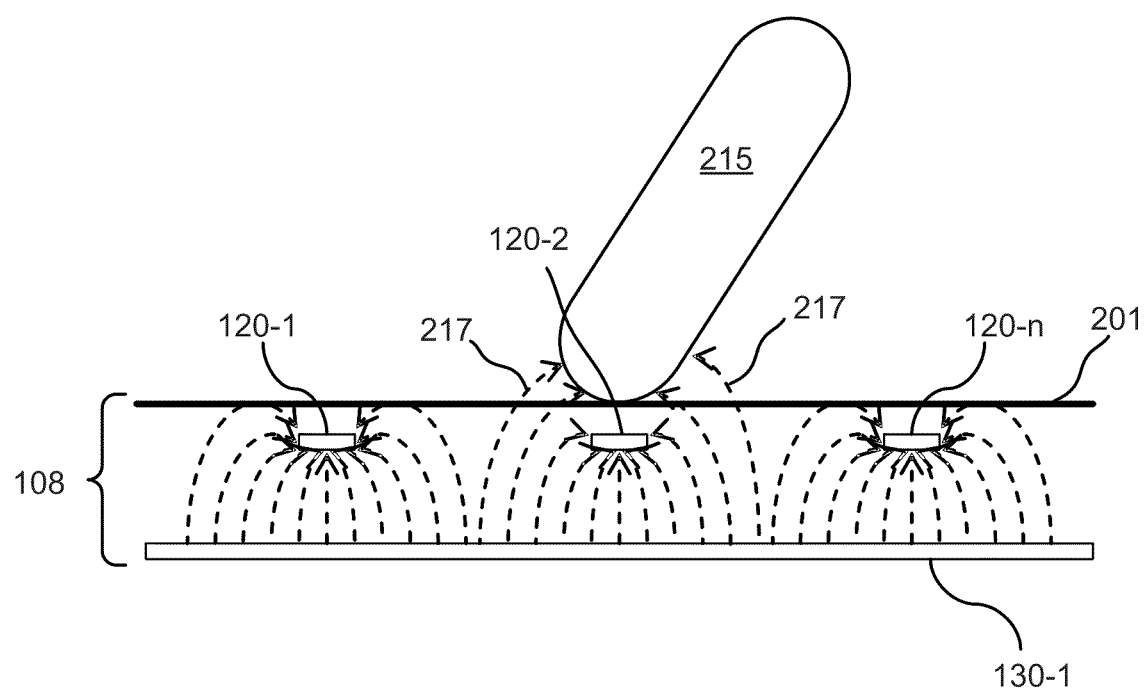
FIG. 2 shows an example of an external object drawing away part of an electric field that would otherwise have coupled the transmitter and receiver sensor electrodes.

FIG. 2 shows an example of an external object drawing away part of an electric field that would otherwise have coupled the transmitter and receiver sensor electrodes. FIG. 2 illustrates how, in some embodiments, transcapacitive sensing schemes may detect changes in capacitive coupling between sensor electrodes when a separate electrode (e.g., an external object such as a finger) is brought near. In FIG. 2, a conductive external object 215 interacts with a system or device (e.g., device 100 of FIG. 1) having transmitting sensor electrodes 130 (130-1 visible) underlying receiving sensor electrodes 120-1, 120-2 and 120-n. For the portion of sensor 108 shown in FIG. 2, conductive external object 215 draws away part of the electric field 217 that would otherwise have directly coupled the middle receiving sensor electrode 120-2 with the transmitting sensor electrode 130. This interaction changes the readings obtained from the middle receiving sensor electrode 120-2. Also shown is input surface 201, which in one embodiment, is the cover sheet that a conductive external object 215 may touch or come near in order for the conductive external object 215 to interact with the system. It is appreciated that input surface 201 was not illustrated in FIG. 1, so as not to obscure other features of device 100.

Transcapacitive sensing tends to be more localized at overlaps, interconnects, perimeters, and other locations where two electrodes (transmitting and receiving) are disposed in such a way that their fringing field lines may be affected by an external object. In many embodiments, transcapacitive sensor electrodes may be close to each other and may be relatively small, and thus are limited in their ability to detect inputs far away. The coupling from the transmitting sensor electrode to the receiving (or shielding) sensor electrode dominates, and may not be affected substantially by external objects that are far away.

In many mobile devices, the power source (e.g., a cell phone battery for a mobile phone) may provide the system ground or may be driven to be substantially constant relative to the system ground. Thus, the power source may be substantially undetectable (e.g., effectively substantially invisible) to a transcapacitive sensing system that drives the receiving sensor electrodes substantially stationary with respect to system ground. This may be because if the receiving sensor electrode is constant with respect to system ground, and the power source is constant with respect to system ground, then there may be no change in electrical potential between the two, in response to input by one or more external objects nearby. However, if the power source on the phone changes in voltage with respect to system ground, then it effectively emits electric signals to the receiving sensor electrodes and can be detected by a transcapacitive sensing scheme. When the capacitive coupling of a transmitter sensor electrode modulated relative to system ground is changed it can be detected by the change in coupled charge.

"Mixed capacitance," "mixed capacitive coupling," "absolute/trans capacitance," or "absolute/trans" may be used to indicate capacitive coupling to both system ground and one or more transmitting sensor electrodes that may be modulated relative to system ground. To produce such a mixed capacitance, some or all transmitting and receiving sensor electrodes may be electrically modulated relative to each other and to system ground. This approach works because a receiving sensor electrode modulated relative to system ground may detect absolute capacitance, and can detect transcapacitive coupling to any transmitting sensor electrode(s) modulated differently from system ground and from the receiving sensor electrode.

Some embodiments distinguish the separate absolute capacitance and transcapacitance portions. In that case, two or more measurements may be taken. For example, a first measurement may be taken with the receiving sensor electrode(s) modulated in a first way and the transmitting sensor electrode(s) modulated in a second way. The first and second way may be the same or different. Then, a second measurement may be taken with the receiving sensor electrode(s) kept at the first way of modulation and the transmitting sensor electrode(s) modulated in a third way (such that the modulation of the transmitter sensor electrode(s) relative to the receiver sensor electrode(s) is changed from the second way). This change in the transmitting sensor electrode modulation may be accomplished in a myriad of ways, including but not limited to the following: changing a voltage magnitude; changing the voltage phase; switching between binary ON/OFF voltages; flipping a sign of the voltage swing from positive to negative; changing the voltage swing to be higher or lower; etc. More than two measurements may be taken by some embodiments, such as to reduce noise or to better accommodate a more complex combination of transmitting sensor electrodes. Such a multi-measurement approach enables relatively straightforward estimation of the absolute capacitance and transcapacitance contributions.

Some embodiments of the present technology comprise systems that use a same plurality of sensing electrodes in making two different types of capacitive measurements. This enables determination of two different capacitive measurements for some or all of the plurality of sensor electrodes. In some embodiments, at least one of the two different capacitive measurements includes an absolute capacitance portion, and at least one of the two different capacitive measurements includes a transcapacitance portion. Some embodiments are configured to use the two different capacitive measurements to determine both the absolute capacitance and transcapacitance coupling to the sensor electrode associated with the two different capacitive measurements. Thus, some embodiments achieve a greater number of capacitance measurements, improved performance (e.g., improved resolution), additional functionality, a greater set of sensing regions, or any combination thereof than pure absolute capacitance sensing or pure transcapacitive sensing may generate alone.

In some embodiments in accordance with the present technology, the same (or substantially the same) sensor electrodes may be used for both absolute and transcapacitive sensing. For example, separate sets of sensor electrodes for sensing absolute capacitance and transcapacitance may mean that one set interferes with the other (i.e., the absolute sensing sensor electrodes interfere with the transcapacitive sensing scheme, or vice versa).

Depending on the system design, embodiments of the present technology may have a sensor electrode that is a dedicated absolute capacitance sensor electrode, a dedicated transmitting sensor electrode for transcapacitive sensing, a dedicated receiving sensor electrode for transcapacitive sensing, or a combination thereof. For example, a sensor electrode may be an absolute capacitance sensor electrode and a receiving sensor electrode for a transcapacitive system. As another example, a sensor electrode may be capable of transmitting and receiving for a transcapacitive sensing scheme at different times (or simultaneously). As another example, a sensor electrode may be configured as a sensor electrode for absolute sensing as well as be capable of transmitting and receiving for a transcapacitive sensing scheme at different times (or simultaneously). Other such combinations are possible, and contemplated.

In cases where the transmitting sensor electrode is simultaneously the receiving sensor electrode, absolute capacitance is generally also detected (either pure absolute capacitance if no nearby objects couple transcapacitively, or mixed if one or more objects couple transcapacitively). Thus, it is possible in some embodiments to transmit and receive with all sensor electrodes simultaneously (ignoring when demodulation of the received indicia actually occurs). The received indicia would include some absolute capacitance effects in this case.

In many embodiments, the sensor electrodes may not be deflected toward each other for proper transcapacitive sensing to occur. That is because these sensor electrodes detect input in how the input directly changes the field lines coupling the transmitting and receiving sensor electrodes (e.g., by drawing away or providing field lines), not by how the input may change a separation distance between sensor electrodes and thus the capacitive coupling between them. In fact, in many such embodiments, such deflection may be detrimental for proper capacitive sensing.

In some embodiments, voltage is driven and the resulting current (or charge) is measured. In some embodiments, current is driven and the resulting voltage is measured. With many such drive-current-measure-voltage systems, there may be an absolute capacitance measurement since one cannot make sure that a sensor electrode is not modulated with respect to system ground. However, it may still be possible to determine the absolute and transcapacitive coupling to an external object.

For example, a first measurement can be taken with some or all of the non-sensing electrodes (e.g., other sensor electrodes not sensing at that time and any shield/guard electrodes) driven substantially the same way as the sensing electrodes. This provides a guarded absolute capacitance measurement (with the other electrodes providing a guard to transcapacitive coupling to other sensor electrodes). A second measurement can be taken with some or all of the non-sensing electrodes substantially constant with respect to system ground. This may or may not be a purely absolute capacitance measurement, since other components nearby may not be held substantially constant with respect to system ground; but it provides measurements of the absolute capacitance of the sensing electrodes without the capacitive coupling of the guarding electrodes, so the later can also be determined. Since these two measurements are independent, the transcapacitive and absolute capacitance components may be derived from them.

This is one example that shows that pure absolute and pure transcapacitance measurements are not necessary to determine exact contributions from absolute and transcapacitive coupling. Modulating a transmitter in amplitude and phase can provide independent readings from which independent components can be derived. This may apply to more than drive-current-measure-voltage systems.

Some embodiments may generate the different types of capacitive measurements by modulating one or more electrodes that may have been originally included for guarding with different guard signals and making capacitive measurements with each different guard electrode modulation. Some embodiments may utilize a first mode where the guard signal creates an over guard (larger in amplitude than the sensor) and a second mode where the guard signal creates a under guard. By using different guard signals, two different capacitance measurements can be made, and the absolute capacitance and transcapacitance coupling may be determined.

Some embodiments may generate the different types of capacitive measurements by modulating one or more electrodes between a guard signal that varies with respect to system ground, and a voltage substantially constant with respect to system ground.

In many embodiments, the modulation of the external object cannot be controlled by the system. However, in many cases, the electrical potential of the external object in such a system may be assumed to be constant relative to system ground, and thus is an AC ground.

Figure 3:
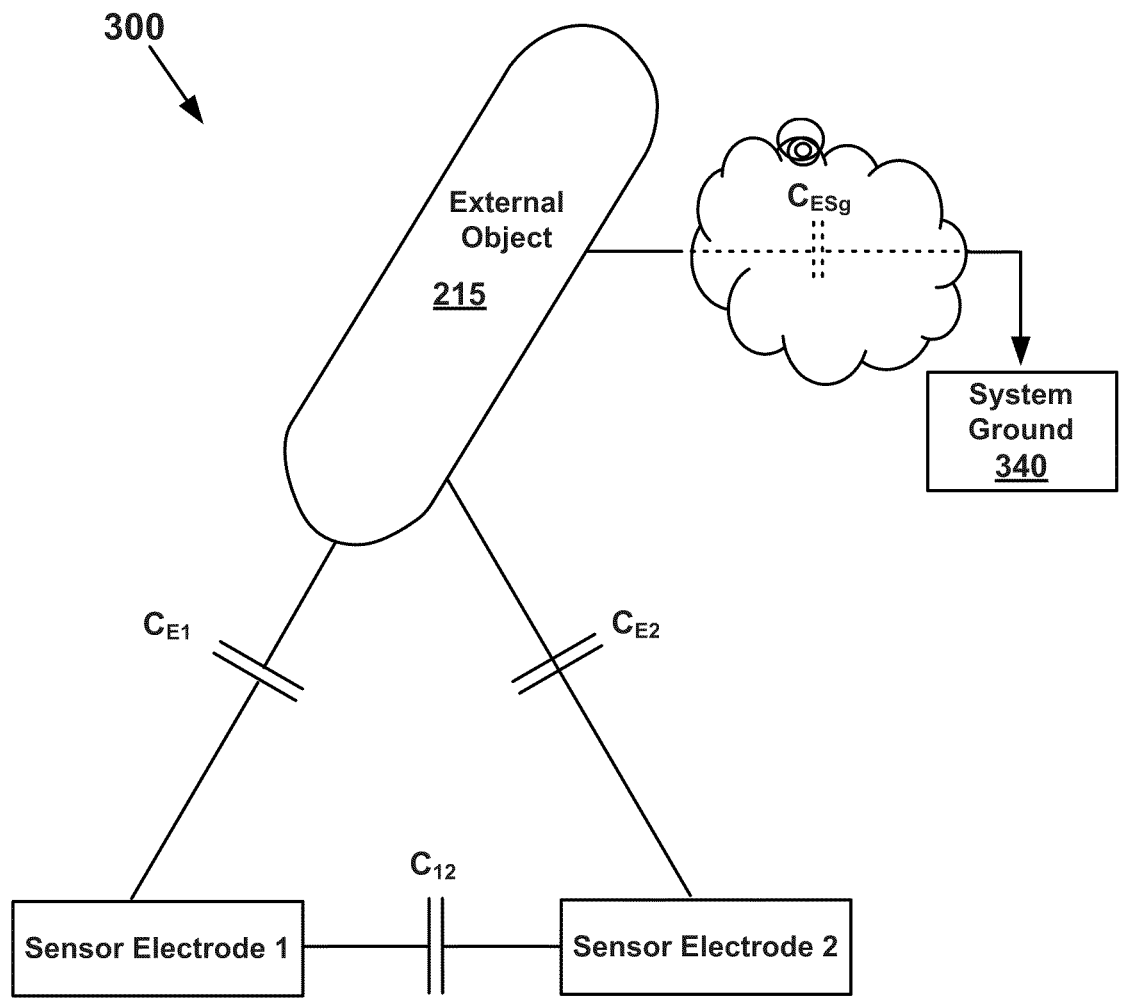
FIG. 3 shows a simplified model of a sensor with two sensor electrodes and one external object, in accordance with embodiments of the present technology.

FIG. 3 shows a simplified model of a sensor with two sensor electrodes and one external object, in accordance with embodiments of the present technology. In FIG. 3 a model of a system 300 with two sensor electrodes, sensor electrode 1 ($S_1$) and sensor electrode 2 ($S_2$) and one external object 215 (also referred to as "input object" and "I") that has been simplified for clarity of explanation is shown in accordance with embodiments of the present technology. In real world applications, there may be additional external objects (that may or may not be intended as input objects), other sensor electrodes, noise, etc. that are not included in this simplified model. Also, some systems with only two sensor electrodes and one external object may be more complex. For example, the capacitive coupling $C_{12}$ between sensor electrodes $S_1$ and $S_2$ may start to depend on the external object capacitive coupling (either $C_{E1}$ or $C_{E2}$). In many embodiments, the capacitance coupling $C_{ESg}$ coupling the external object 215 to system ground 340 may be greater or equal to the sum of $C_{E1}$ and $C_{E2}$.

In FIG. 3, $C_{E1}$ shows the capacitive coupling between sensor electrode $S_1$ and the external object 215; $C_{E2}$ shows the capacitive coupling between sensor electrode $S_2$ and the external object 215; and $C_{12}$ shows the capacitive coupling between sensor electrode $S_1$ and sensor electrode $S_2$. Capacitance $C_{ESg}$ shows the effective capacitive coupling between the external object 215 and system ground 340. External object 215 may not be directly coupled to system ground 340 (e.g., not a tethered stylus hooked to system ground 340, or something else directly hooked to system ground 340). Though not illustrated in FIG. 3, it is appreciated that external object 215 has some amount of capacitive coupling to free space (the universe at large), which in turn has some amount of capacitive coupling to system ground 340. These two capacitances in series may provide the capacitive coupling of the external object 215 to system ground 340.

Where the capacitive coupling $C_{ESg}$ between external object 215 and system ground 340 is relatively small (e.g., often the case for a bead of water or penny on a surface of a touch pad of conventional size), the transcapacitive coupling $C_{12}$ between sensor electrodes $S_1$ and $S_2$ is noticeably greater than the absolute capacitive coupling of either sensor electrodes $S_1$ or $S_2$ to system ground 340. Thus, in some embodiments, when processing system 110 (or some portion thereof), of FIG. 1, differentiates the separate contributions of absolute capacitance and transcapacitance, this enables differentiating sizes of objects (e.g., pennies vs. human-sized objects), the floating/non-floating state of sensor system ground (e.g., plugged in to a power source vs. floating on a table), etc.

FIG. 4 shows several non-limiting modulation examples, in accordance with embodiments of the present technology. Referring now to both FIG. 3 and FIG. 4 the modulation of sensor electrode $S_1$ and sensor electrode $S_2$ may be controlled by the a processing system or portion thereof (such as processing system 110 and/or sensor electrode controller 140), and be modified in any number of ways. Table 400, illustrated in FIG. 4, highlights several different modulation options, and the approximate $V_{OUT}$, where: $V_{E2}$=the electrical potential at external object 215 relative to the electrical potential at sensor electrode $S_2$; $V_{E1}$=the electrical potential at external object 215 relative to the electrical potential at sensor electrode $S_1$; $V_{12}$=the electrical potential at sensor electrode $S_1$ relative to the electrical potential at sensor electrode $S_2$; $V_{OUT} \approx Q_{OUT}/C_I$, where $V_{OUT}$ is proportional to the charge transferred between sensor electrode 1 and sensor electrode 2 and inversely proportional to an accumulating capacitance $C_I$.

In the "guarded absolute capacitance" case, sensor electrode $S_1$ and sensor electrode $S_2$ may be driven in the same way. Square waves are shown in as driving signals, for convenience, and other waveforms (such as saw tooth, sinusoidal, complex, etc.) may be used. Since sensor electrode $S_1$ and sensor electrode $S_2$ may be driven in the same way, sensor electrode $S_1$ may have no effect on the output of the sensor circuitry of a sensor device on $S_2$. Thus, assuming that the effects of other nearby objects (e.g., environmental noise, other electrodes, etc.) on sensor electrode $S_2$ may be ignored, the resulting reading of sensor electrode $S_2$ may be considered an absolute capacitance measurement. Since sensor electrode $S_1$ helps guard sensor electrode $S_2$ from other nearby objects that may be modulated differently from sensor electrode $S_2$, this modulation option may be termed "guarded absolute capacitance"). Also, as can be seen, this modulation method cannot produce a direct measurement of $C_{12}$.

Assuming ideal components, the charge at $C_{E2}$ is the capacitance $C_{E2}$ times the voltage drop across the capacitor ($Q_{E2}=C_{E2}V_{E2}$) and the effective current flow across $C_{E2}$ is the time derivative ($i_{E2}=dQ_{E2}/dt=C_{E2}V_{E2}/dt$). Further assuming that the components of the sensor circuitry are ideal yields a similar relationship between $V_{OUT}$, $C_I$, and the current that flows through $C_I$. Conservation of charge then leads to the approximate $V_{OUT}$ estimate on the right of side of the table 400 of FIG. 4, where $V_{OUT}$ is shown as approximately $(C_{E2})(\Delta V_{E2})/C_I$. As can be seen, this modulation enables the direct calculation of $C_{E2}$.

In the "grounded absolute capacitance" case, sensor electrode $S_1$ is held constant relative to system ground (the same as with the external object). Sensor electrode $S_2$ is modulated differently from the external object and sensor electrode $S_1$. In such a case, the voltage $V_{E1}=0$, and the time derivative $dV_{E1}/dt=0$. Further, the voltage $V_{12}=V_{E2}$, and the time derivatives are also the same ($dV_{12}/dt=dV_{E2}/dt$). In such a case, $V_{OUT}$ is approximately $(C_{12}+C_{E2})\Delta V_{E2}/C_I$. As can be seen, this modulation yields an absolute capacitance measurement that includes a contribution from the system ground that effectively is coupled through sensor electrode $S_1$ as well as a contribution through $C_{E2}$.

In the "shielded transcapacitance" sensor electrode $S_2$ is held constant relative to system ground (the same as with the external object), and sensor electrode $S_1$ is modulated differently from the external object and sensor electrode $S_2$. A similar analysis as the above leads to an estimate of $V_{OUT}$ as $(C_{12})(\Delta V_{12})/C_I$, such that the measurement allows a direct calculation of $C_2$. The position of the external object can be indirectly measured by its effect on $C_{12}$.

In the "mixed absolute/trans" case, both sensor electrodes $S_1$ and $S_2$ are modulated with respect to system ground, and are modulated in opposition to each other. A similar analysis as the above leads to an estimate of $V_{OUT}$ as $(C_{E2}-2C_{12})(\Delta V_{E2})/C_I$.

It should be understood that the sensor electrodes in a capacitive sensing device may be modulated in numerous manners that are not shown in the table 400 of FIG. 4. For example, both sensor electrode $S_1$ and sensor electrode $S_2$ may be modulated differently with respect to each other, but not be modulated in opposition.

In any case, it can be seen that some of the modulations described above are sufficient by themselves for yielding estimates of particular capacitances (e.g., guarded absolute capacitance for $C_{E2}$ and shielded transcapacitance for $C_2$). Combinations of the different modulations enable estimates as well (e.g., guarded absolute and grounded absolute enables calculation of $C_{E2}$ and $C_{12}$). There are also many methods of modulation that would yield information for estimating the different capacitances $C_{E1}$, $C_{E2}$, and $C_{12}$. For example, where there are two unknowns in the resulting analysis, two different modulations that do not produce degenerate equations are sufficient for solving for these two unknowns, or three modulations are sufficient for solving for three unknowns. Also some capacitances may be modeled, measured or otherwise characterized for a particular device or design before the unknowns are to be solved.

Example Sensor Electrodes and Sensor Arrays

As implemented, the sensor electrodes may be of various different shapes, sizes, layouts, and the like. For example, and referring to FIGS. 5A and 5B, a top view and a side view, respectively, are shown of a portion of a sensor electrode pattern, in accordance with embodiments of the present technology. It is appreciated that the arrangements shown in FIGS. 5A and 5B can be considered detail views of the sensor electrodes illustrated in FIG. 1. Sensor electrodes 120-1 and 130-1 are shown as intersecting each other. The cross section AA', of FIG. 5A is represented by FIG. 5B. Capacitive coupling 525 shows where a capacitive coupling may exist between sensor electrode 120-1 and 130-1, in one embodiment.

Referring now to FIGS. 6A, 6B and 6C, a top view is shown of example sensor electrode patterns, in accordance with embodiments of the present technology. FIG. 6A shows sensor electrodes 605 and 610 interleaved with each other, without intersecting. FIG. 6B shows sensor electrodes 615 and 620 interleaved with each other, while intersecting at least once. FIG. 6C shows two sensor electrodes, 625 and 630, where sensor electrode 630 is round, and surrounded by sensor electrode 625 in a plane. In other embodiments, sensor electrode 615 and 620 may be disposed in the same plane, where a jumper of sensor electrode 615 is formed over sensor electrode 620, and where a capacitive coupling between sensor electrode sensor electrodes 615 and 620 may primarily be out of the plane. In some embodiments, sensor electrodes 615 and 620 represent one cell or pixel, and a plurality each sensor electrode may be disposed forming multiple cells or pixels of a 2-D capacitive sensor.

Figure 7:
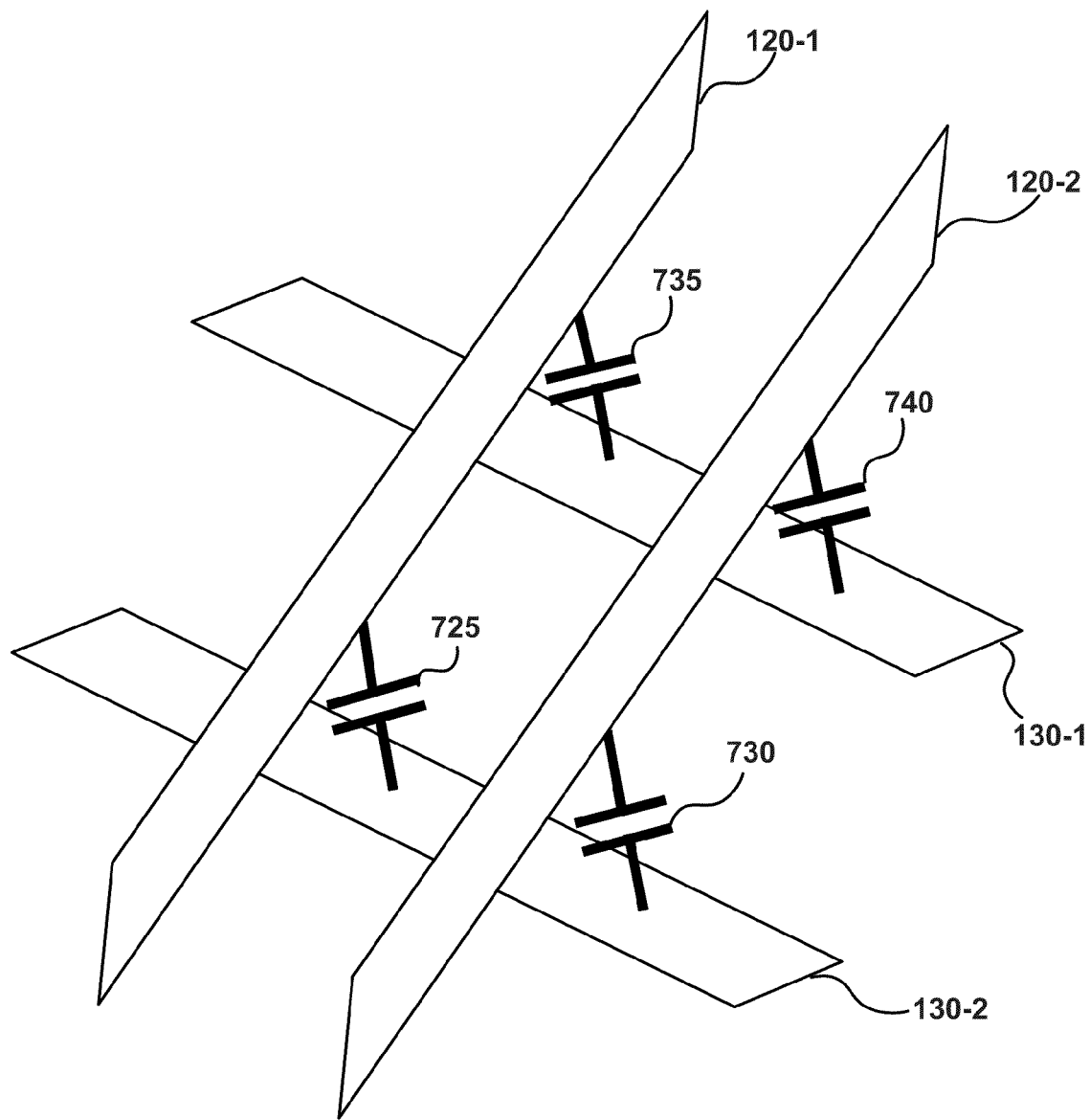
FIG. 7 shows a combination of an absolute capacitance sensor and a transcapacitive image sensor, in accordance with embodiments of the present technology.

FIG. 7 shows a combination of an absolute capacitance sensor and a transcapacitive image sensor, in accordance with embodiments of the present technology. For clarity, no substrate is illustrated. In FIG. 7 (which can be thought of as an explanatory detail regarding the sensor electrodes illustrated in FIG. 1), an example layout of four sensor electrodes is shown in accordance with embodiments of the present technology. FIG. 7 shows one simple implementation where transmitting sensor electrodes are overlaid by receiving sensor electrodes. Sensor electrodes 130-1 and 130-2 are operated as transmitting sensor electrodes, and sensor electrodes 120-1 and 120-2 are operated as receiving sensor electrodes. Also shown in FIG. 7 are four capacitances, 725, 730, 735 and 740 between the two transmitting and receiving sensor electrodes. It is appreciated that a greater or lesser number of sensor electrodes can be arranged in a similar manner.

Referring again to FIG. 1, in one embodiment, the sensor electrodes of device 100 can be utilized as both an absolute capacitance sensor and a transcapacitive sensor, in accordance with embodiments of the present technology. FIG. 1 shows an example rectilinear row-column layout. Although only two column sensor electrodes and two row sensor electrodes are illustrated for purposes of simplicity, it is appreciated that there can be many more in other embodiments. As illustrated in FIG. 1, the row of sensor electrodes 130 lie underneath the column sensor electrodes 120, and are configured to be further away from an input object during standard operation (see e.g., FIG. 2 for an example of an external input object 215 in relation to row sensor electrodes 130 and column sensor electrodes 120). Although illustrated as having similar dimensions, in some embodiments, the row sensor electrodes 130 may have more individual or total surface area that the column sensor electrodes 120, or vice versa.

In an absolute capacitance sensing mode, one or more of the column sensor electrodes 120 may be modulated with respect to system ground, and used to detect absolute capacitance. At the same time, one or more of the row sensor electrodes 130 may be modulated in substantially the same way as the modulated column sensor electrodes 120, and effectively function as electrical guards.

In a transcapacitance sensing mode, one or more of the row sensor electrodes 130 may be modulated with respect to system ground and one or more of the column sensor electrodes 120. This enables sensing of the transcapacitance between the row and column sensor electrodes 130 and 120, respectively.

Taken together, these two modes allow the same sensor electrodes to detect input relatively farther away from the sensor device using absolute capacitance measurements, and to detect input relatively closer to the sensor device using transcapacitance measurements (or using a combination of transcapacitive measurements and absolute capacitance measurements).

Example Capacitive Sensor Device-Structure

Figure 8:
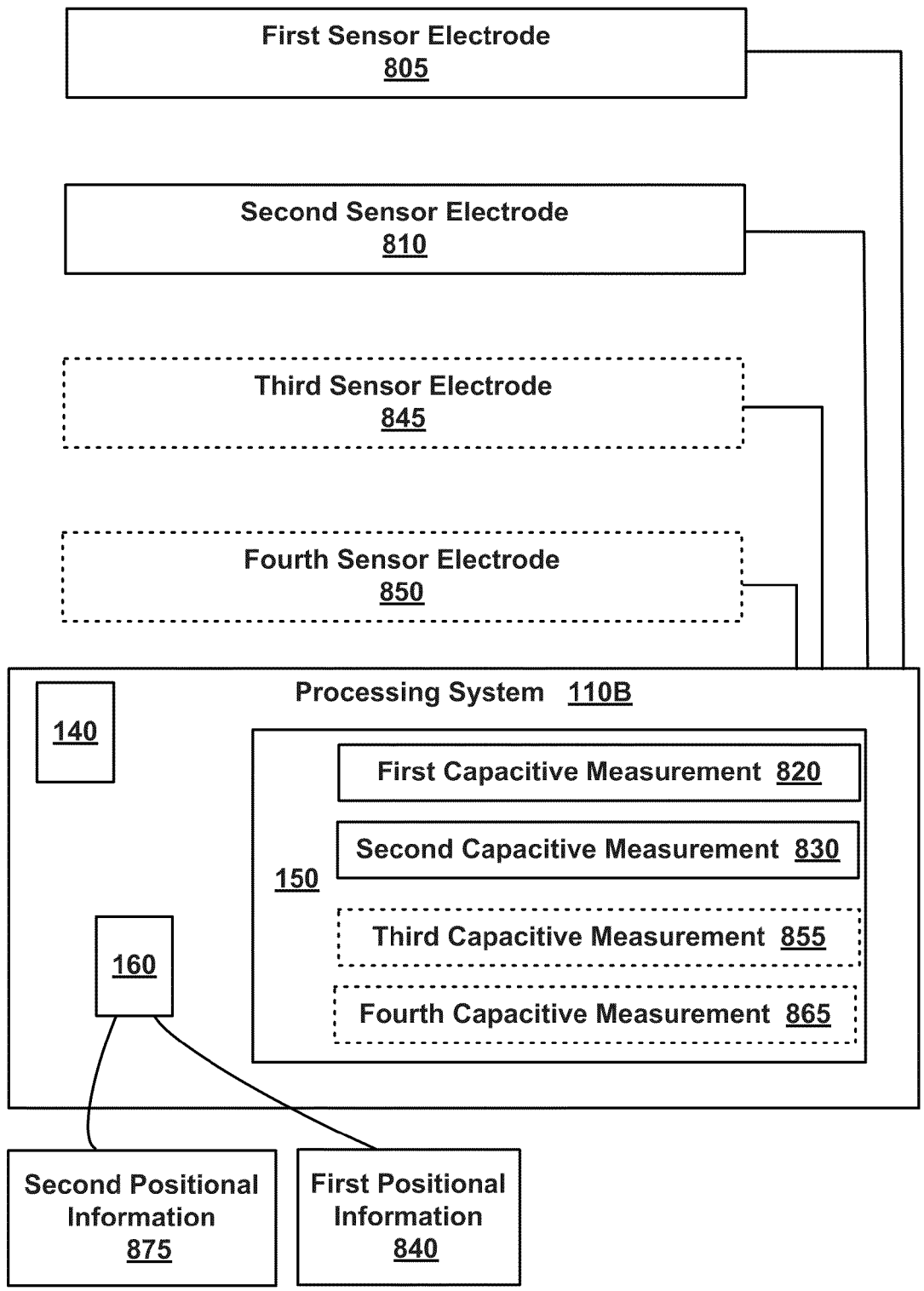
FIG. 8 is a block diagram of an example capacitive sensor device, in accordance with embodiments of the present technology.

Referring now to FIG. 8, a block diagram of a capacitive sensor device 800 is shown in accordance with embodiments of the present technology. In one embodiment, the capacitive sensor device 800 comprises a first sensor electrode 805, a second sensor electrode 810, and a processing system 110B coupled to the first sensor electrode 805 and the second sensor electrode 810. Sensor electrodes 805 and 810 may be aligned on axes that are parallel with one another or may be aligned on axes that are non-parallel with one another. Additionally, sensor electrodes 805 and 810 and may be of the same or different surface areas. In one embodiment, sensor electrode 810 may comprise substantially greater surface area than sensor electrode 805. In one embodiment, processing system 110B is the same or similar to processing system 110 of FIG. 1 and includes a sensor electrode controller 140, a capacitive measurer 150, and a determiner 160. Sensor electrode controller 140 of processing system 110B selectively emits and receives electrical signals on sensor electrodes which are coupled to processing system 110B. Capacitive measurer 150 measures capacitances using the received signals. Determiner 160 determines information, such as positional information of an input object based upon the capacitance measurements.

In operation, in one embodiment, processing system 110B operates in the above described manner to acquire a first capacitive measurement 820 by both emitting and receiving a first electrical signal with, first sensor electrode 805. In one embodiment, processing system 110B also acquires a second capacitive measurement 830 by emitting and receiving a second electrical signal. The first and second capacitive measurements are non-degenerate. When acquiring the second capacitive measurement 830 one of either first sensor electrode 805 or second sensor electrode 810 is used to perform the emitting and the other of these two sensor electrodes is used to perform the receiving. In one embodiment, when second sensor electrode 810 is used to perform the emitting needed to acquire second capacitive measurement 830, second sensor electrode 810 is substantially larger in surface area (e.g., 25%, 50%, 100%, >100% larger) than first sensor electrode 805. In one embodiment, when first sensor electrode 805 is used to perform the emitting needed to acquire second capacitive measurement 830, first and second capacitive measurements 820, 830 are performed contemporaneously. After acquiring the non-degenerate capacitive measurements, processing system 110B then determines first positional information 840 using first and second capacitive measurements 820, 830. The two measurements are non-degenerate when they are not mathematical multiples of each other (e.g., the modulation amplitudes associated with the two measurements are not just multiples or fractions of each other). For example, in one embodiment, when processing system 110B uses sensor electrode 805 to both emit and receive an electrical signal to acquire a first capacitive measurement, sensor electrodes 805 is modulated in a first way, and when processing system 110B uses sensor electrode 810 to emit a second electrical signal and sensor electrode 805 to receive the second electrical signal to acquire a second capacitive measurement, sensor electrode 810 is modulated in a second way, different than the first way. This produces first and second capacitive measurements that are non-degenerate. In one embodiment, the non-degenerate measurements allow for both the absolute capacitive and transcapacitive components to be derived. First positional information may be output from processing system 110B and may describe a position of an input object (e.g., external object 215 of FIG. 2).

In one embodiment, processing system 110B determines first positional information 840 by making an estimate using the first and second capacitive measurements 820, 830. The estimate is of a capacitive coupling between the first sensor electrode 805 and one of an input object and the second sensor electrode 810. When making such an estimate, the first positional information 840 is based at least in part on this estimate of such capacitive coupling. In one embodiment, the capacitive coupling that is estimated is the capacitive coupling between the first sensor electrode 805 and the input object. In one such embodiment, processing system 110B is further configured to make a second estimate using the first and second capacitive measurements 820, 830. The second estimate is of a capacitive coupling between first sensor electrode 805 and second sensor electrode 810.

In one embodiment, processing system 110B of capacitive sensor device 800 determines at least one of a size and type of the input object using the first and second capacitive measurements 820, 830. The size may be determined in various manners, such as being determined as measurements (millimeters) or preset determined based upon a predetermined size category such as small, medium, or large; or grounded or not grounded. The type may be determined from a predetermined list of "types," such as a finger, thumb, stylus, writing utensil, or water drop.

In one embodiment, processing system 110B of capacitive sensor device 800 acquires the first capacitive measurement 820 during a first time period and then acquires the second capacitive measurement 830 during a second time period. The first and second time periods may be contemporaneous, partially overlay, or be completely different from one another. In an embodiment where the time periods are different, this can comprise processing system 110B modulating second sensor electrode 810 with respect to a system ground during the first time period, such that second sensor electrode 810 electrically guards first sensor electrode 805. As described in FIG. 4, in one embodiment, processing system 110B of capacitive sensor device 800 may modulate second sensor electrode 810 with respect to a system ground during the first time period by modulating second sensor electrode 810 substantially similarly to the manner in which first sensor electrode 805 is being modulated during this first time period.

In one embodiment, capacitive sensor device 800 further comprises: a third sensor electrode 845 and a fourth sensor electrode 850 that are coupled to processing system 110B. When additionally sensor electrodes are present, processing system 110B can utilize these additional sensor electrodes in a similar manner to sensor electrodes 805 and 810 to acquire additional capacitive measurements (which are non-degenerate). For example, in one embodiment, processing system 110B acquires a third capacitive measurement 855 by emitting and receiving a third electrical signal using third sensor electrode 845 and acquires a fourth capacitive measurement 865 by emitting and receiving a fourth electrical signal. It is appreciated that either one of the third and the fourth sensor electrodes 845, 850 may be used to perform the emitting while the other of the third and fourth sensor electrodes 845, 850 performs the receiving. Processing system 110B then determines second positional information 875 using third capacitive measurement 855 and fourth capacitive measurement 865.

Example Method of Determining First Positional Information Using a First and Second Capacitive Measurement Referring now to FIG. 9, a flowchart of a method 900 of determining positional information using a capacitive sensor device comprising a first sensor electrode and a second sensor electrode is shown in accordance with embodiments of the present technology. In one embodiment, method 900 is a method of operation of device 800 of FIG. 8. Method 900 will be described with reference to the previous description of the operation of capacitive sensor device 800, processing system 110B, first sensor electrode 805 and second sensor electrode 810 all of FIG. 8.

Referring now to 905 of FIG. 9, a first electrical signal is emitted and received with the first sensor electrode to acquire a first capacitive measurement. In one embodiment, this comprises processing system 110B emitting and receiving this signal with first sensor electrode 805 when acquiring first capacitive measurement 820.

Referring now to 910 of FIG. 9, a second electrical signal is emitted and received to acquire a second capacitive measurement. The first and second capacitive measurements are non-degenerate. One of the first and second sensor electrodes performs the emitting and the other of the first and second sensor electrodes performs the receiving. In one embodiment, this comprises processing system 110B using either sensor electrode 805 or 810 to perform the emitting, and then using the other of the two to perform the receiving when acquiring second capacitive measurement 830.

Referring now to 915 of FIG. 9, positional information is determined using the first and second capacitive measurements, where the first and second capacitive measurements are non-degenerate. In one embodiment, processing system 110B determines the positional information from the first and second capacitive measurements 820, 830. In one embodiment, the positional information comprises at least one of a position, size, and type of an input object.

In one embodiment, the first electrical signal is emitted and received with first sensor electrode 805 during a first time period to acquire first capacitive measurement 820. A second electrical signal is emitted and received during a second time period to acquire second capacitive measurement 830. In one embodiment, the first and second time period are different from one another and do not overlap.

Furthermore, in one embodiment, when second sensor electrode 810 is used to perform the emitting during a second time period, second sensor electrode 810 is also modulated with respect to a system ground during the first time period, such that second sensor electrode 810 electrically guards first sensor electrode 805. As has been described in conjunction with FIG. 4, this modulating of second sensor electrode 810 can comprise modulating sensor electrode 810 substantially similarly to first sensor electrode 805 during the first time period. In other words, both sensor electrode 805 and sensor electrode 810 may be modulated with similar electrical signals (e.g., square wave, sine waves, etc.) during the first time period.

Figure 15:
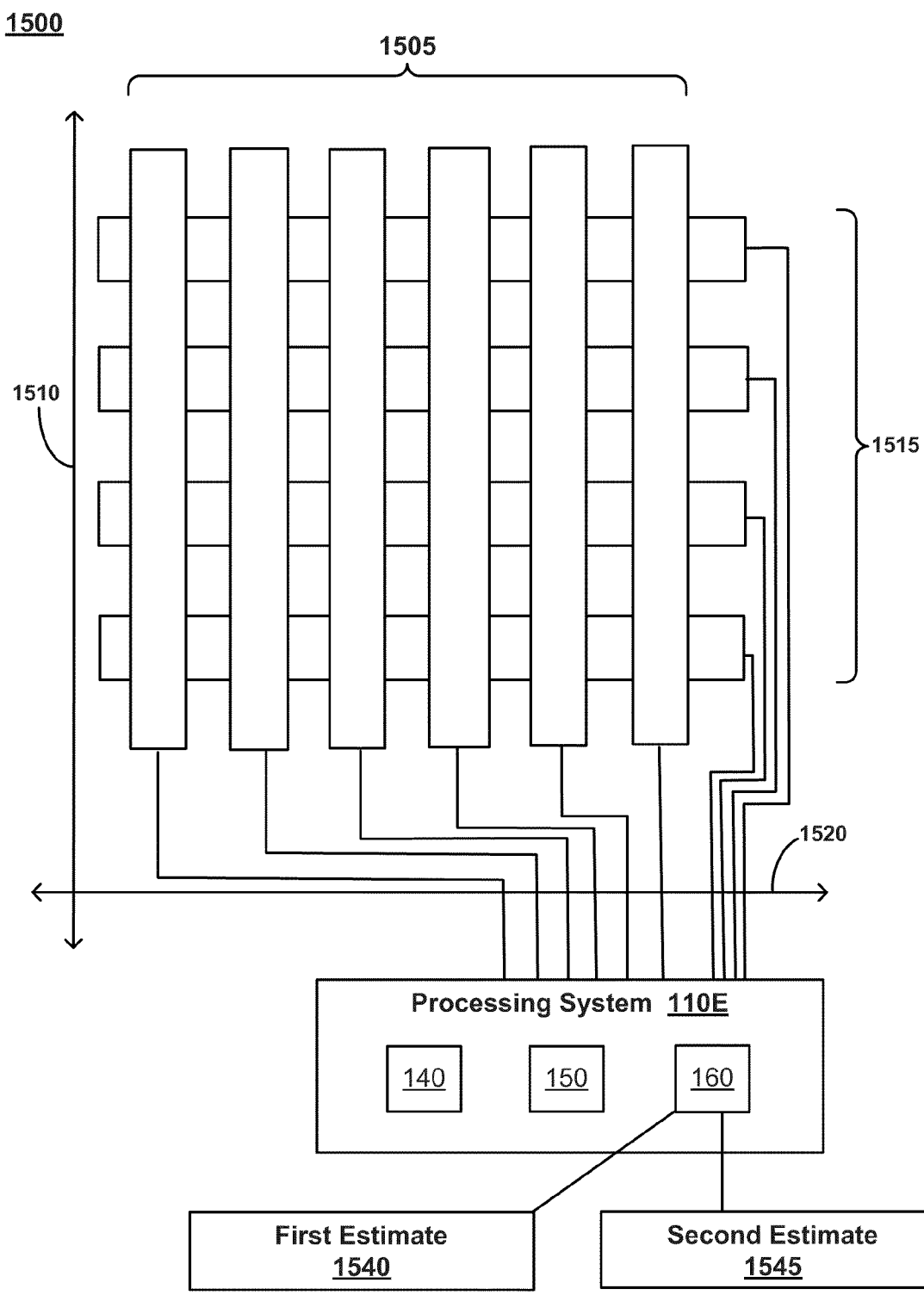
FIG. 15 is a block diagram of an example capacitive sensor device, in accordance with embodiments of the present technology.

Some embodiments of method 900 enable lower average power consumption with a capacitive sensor device than traditional sensing methods. It is appreciated that, combined absolute and transcapacitance sensing, as has been described herein, may enable power consumption reduction. For example, such combined sensing may reduce power consumption in an image sensing integrated circuit (IC) for a capacitive image sensor such as device 100, device 800, device 1000 (FIG. 10), device 1300 (FIG. 13), and/or device 1500 (FIG. 15).

In many embodiments of capacitance imaging touch sensors, a full scan of all the "pixels" is used to create the image. Sensors shown in FIGS. 1, 10, 12, 13, and 15 can be used for imaging. Each "pixel" may be associated with a spatial location in the touch sensor where a change in capacitive coupling can be determined. The image may be used to determine the existence or some other information (e.g., location, motion) of one or more input objects.

Using the image to determine the existence of input object(s) may be used to control when the processing system of the touch sensor (often an ASIC or other computer chip) goes to sleep and wakes up. In some embodiments, a chip of the touch sensor turns on periodically to look for the presence of fingers and goes back to sleep where there is no detection of such input. Sleeping reduces power consumption, but this type of operation may still be costly in terms of power. For example, many transcapacitive touch sensors use a scanning scheme, where transmitting sensor electrodes are driven in sequence. In a row-column sensor electrode setup, the rows may be transmitting sensor electrodes that are driven in sequence, for example, while the columns may be receiving sensor electrodes that receive in sequence or simultaneously. To extract a full image for detecting the presence of input objects, the controller of such a touch sensor scans through one transmitting sensor electrode at a time and gathers one set of ADC data for each transmitting sensor electrode actuation. If the touch sensor has 10 transmitting sensor electrodes, for example, generating the full image would involve scanning through 10 transmitting sensor electrodes and at least 10 sets of ADC conversions.

A more power efficient approach may comprise measuring a total absolute capacitance coupled to some or all of the receiving sensor electrodes of the touch sensor, and using that to determine if the processing system can go back to sleep or should wake up. In a row-column sensor where the columns are the receiving sensor electrodes, this can be accomplished using the receiver sensor channel connected to each column sensor electrode. Taking the same touch sensor with 10 row sensor electrodes as described above, one ADC conversion suffices in most cases. In many embodiments, much of the savings in power consumption comes from using the receiver sensor channels, the CPU, and any memories for a fraction of the time used in the transcapacitive case described earlier.

In many embodiments, a touch sensor processing system may operate mostly in transcapacitive sensing mode. However, the touch sensor may operate in absolute capacitance sensing mode some of the time (e.g., after coming out of power down, often called "wakeup"). When one or more appropriate input devices (e.g., fingers) are detected, the touch sensor may switch to the transcapacitive operating mode. Where no such input objects are detected (e.g., in the absence of finger detection), the touch sensor may return to a power down mode.

In some embodiments, when no fingers are detected after the first wake up, the touch sensor goes back to sleep Then, one or more fingers are detected after the second wake up, the touch sensor switches to the transcapacitive sensing mode. In one embodiment shown the transcapacitive sensing mode involves a scanned sensing scheme, and the absolute sensing mode involves taking all readings simultaneously, and other embodiments may operate otherwise.

Switching between absolute capacitance sensing mode and transcapacitive sensing mode is not limited to controlling when a touch sensor returns to sleep or stays awake. Starting with an absolute capacitance sensing mode and switching to a transcapacitive sensing mode when certain criteria have been met may be used in other applications. Examples of other applications include cases where an initial assessment of the environment proximate to the touch sensor, or an initial assessment of touch sensor functionality, or the like is performed before full imaging. In some embodiments, this approach is used where time constraints mean that there is not enough time to do a full image scan.

Figure 10:
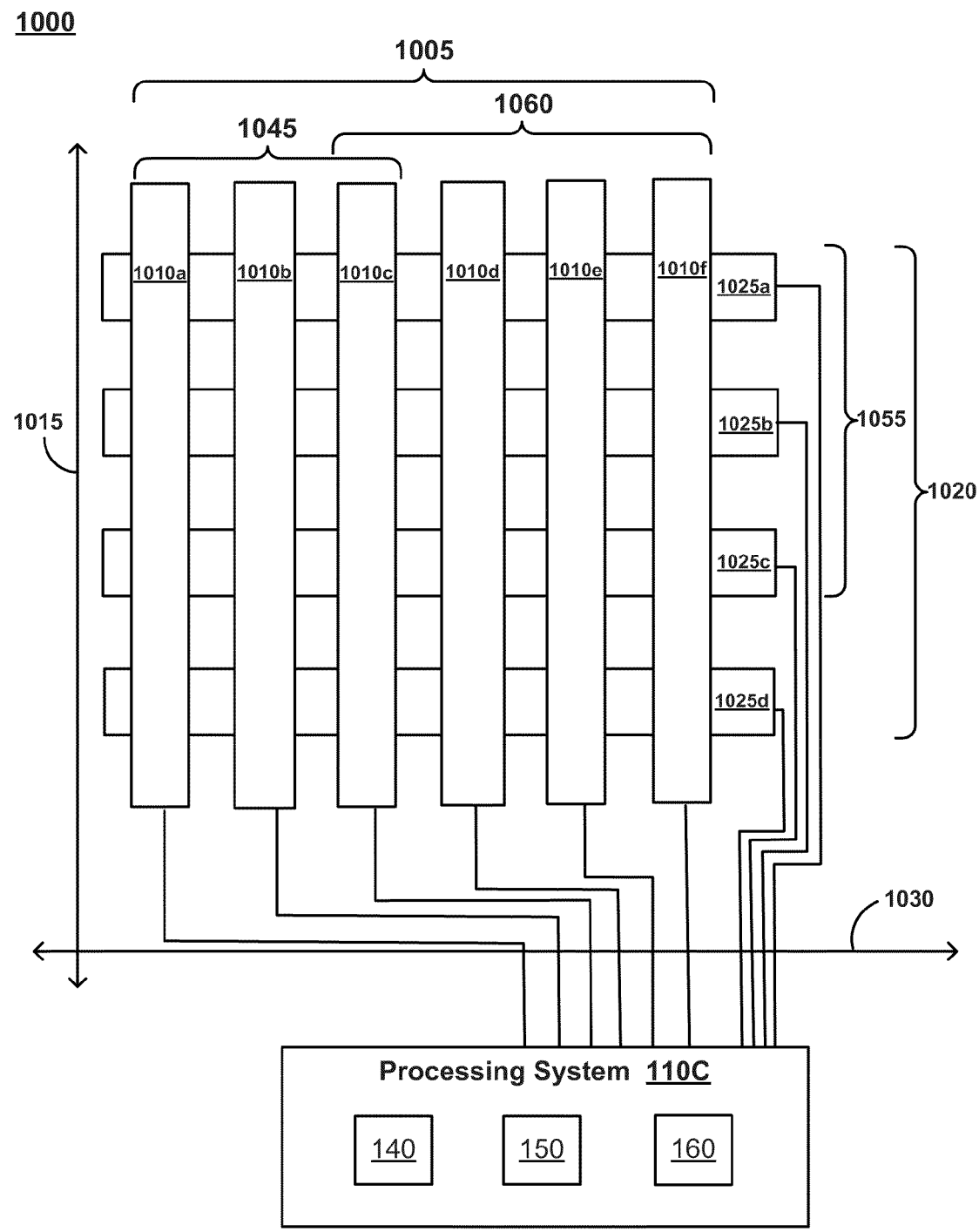
FIG. 10 is a block diagram of an example capacitive sensor device, in accordance with embodiments of the present technology.

Capacitive Sensor Device—at Least One Sensor Electrode in Common—Acquiring a First and Second Plurality of Capacitive Measurements Referring now to FIG. 10, a capacitive sensor device 1000 is shown in accordance with embodiments of the present technology. In one embodiment, capacitive sensor device 1000 comprises: a first plurality of sensor electrodes 1005 (shown as 1010a, 1010b, 1010c, 1010d, 1010e and 1010f in FIG. 10) aligned along a first axis 1015; a second plurality of sensor electrodes 1020 (shown as 1025a, 1025b, 1025c and 1025d in FIG. 10) aligned along a second axis 1030 that is non-parallel to the first axis 1015; and a processing system 110C coupled to the first plurality of sensor electrodes 1005 and the second plurality of sensor electrodes 1020. Although all of the sensor electrodes in FIG. 10 are illustrated as being of similar size, this may not always be the case. For example, as with FIG. 8, sensor electrodes 1020 may be of substantially greater surface area than sensor electrodes 1005. It is appreciated that processing system 110C includes similar features (sensor electrode controller 140, capacitive measurer 150, and determiner 160) that have been previously described in conjunction with processing system 110 (FIG. 1) and processing system 110B (FIG. 8).

In one embodiment, processing system 110C acquires a first plurality of capacitive measurements by emitting electrical signals from a first set 1045 of the first plurality of sensor electrodes 1005 and receiving the electrical signals from the first set 1045 of the first plurality of sensor electrodes 1005 with the first set 1045 of the first plurality of sensor electrodes 1005. In one embodiment, processing system 110C acquires a second plurality of capacitive measurements by emitting electrical signals from a first set 1055 of the second plurality of sensor electrodes 1020 and receiving the electrical signals from the first set 1055 of the second plurality of sensor electrodes 1020 with a second set 1060 of the first plurality of sensor electrodes 1005. It is appreciated and can be seen from FIG. 10 that, in one embodiment, first 1045 and second set 1060 of the first plurality of sensor electrodes 1005 have at least one sensor electrode in common. In FIG. 10, the sensor electrode in common is sensor electrode 1010c, but in other embodiments, it could be another sensor electrode. In various embodiments, processing system 110C may acquire the first and second pluralities of capacitive measurements simultaneously or during separate time periods.

In one embodiment, processing system 110C determines which sensor electrodes will be in the second set (e.g., set 1060) of the first plurality of sensor electrodes 1005, by using the first plurality of capacitive measurements. This can facilitate disambiguation, which is described further below. For example, in one embodiment, if a capacitance measurement is indicative of the likely presence of an input object being measured by the first set of sensor electrodes; more overlapping sensor electrodes may be selected. While in another embodiment, if no input object is likely based on the first capacitance measurement, fewer or no overlapping sensor electrodes may be in the second set.

In one embodiment, the capacitive sensor device 1000 further comprises an input surface associated with the capacitive sensor device 1000. So as not to obscure features, no input surface is illustrated in FIG. 10, however, input surface 201 of FIG. 2 is one example of such an input surface. In an embodiment with such an input surface, processing system 110C is configured to determine a first position estimate of an input object using the first plurality of capacitive measurements. In one embodiment, the first position estimate may locate the input object relatively farther from the input surface. Processing system 110C can then determine a second position estimate of the input object using the second plurality of capacitive measurements, where the second position estimate locates the input object relatively closer to the input surface.

In another embodiment, the processing system 110C is further configured to determine at least one of a size, type, and a capacitive coupling to system ground of an input object using the first and second pluralities of capacitive measurements. It is appreciated that in one embodiment, determiner 160 can perform such determination(s) utilizing techniques which have previously been described herein.

Example Method of Sensing Using a Capacitive Sensor Device

Referring now to FIG. 11, a method 1100 of sensing using a capacitive sensor device, such as capacitive sensing device 1000 is described, in accordance with one embodiment. As illustrated, capacitive sensor device 1000 comprises a first plurality of sensor electrodes 1005 aligned along a first axis 1015 and a second plurality of sensor electrodes 1020 aligned along a second axis 1030 that is non-parallel to the first axis 1015. Method 1100 will be described with reference to the previous description of the operation of capacitive sensor device 1000, processing system 110C, and sensor electrodes illustrated in device 1000.

Referring now to 1105 of FIG. 11, in one embodiment, electrical signals from a first set of a first plurality of sensor electrodes are emitted. In one embodiment, this comprises sensor electrode controller 140 of processing system 110C selecting sensor electrodes and proving electrical signals to be emitted. In one embodiment, sensor electrodes 1005 are the first plurality of sensor electrodes and sensor electrodes 1045 are the first set of sensor electrodes from which the electrical signals are emitted.

Referring now to 1110 of FIG. 11, in one embodiment, the electrical signals from the first set 1045 of the first plurality of sensor electrodes 1005 are received with a second set 1060 of the first plurality of sensor electrodes 1005 to acquire a first plurality of capacitive measurements. It is appreciated that, in one embodiment, controller 140 receives/acquires the electrical signals and capacitive measurer 150 determines the capacitances based on the received electrical signals.

Referring now to 1115 of FIG. 11, in one embodiment, electrical signals are emitted from the second set 1060 of the first plurality of sensor electrodes 1005. In one embodiment, it is appreciated that the first set (e.g., 1045) and second set (e.g., 1060) have at least one sensor electrode (e.g., 1010) in common.

Referring now to 1120 of FIG. 11, in one embodiment, second electrical signals from the second set 1060 of the first plurality of sensor electrodes 1005 are received with a first set 1055 of the second plurality 1020 of sensor electrodes. In the manner previously described, these electrical signals are used to acquire a second plurality of capacitive measurements.

As has previously been described in conjunction with description of FIG. 10, in one embodiment, the electrical signals may be emitted from the first set 1045 of the first plurality of sensor electrodes 1005 while electrical signals are simultaneously emitted from the second set 1060 of the first plurality of sensor electrodes of 1005.

In one embodiment, the second set (e.g., 1060) of the first plurality of sensor electrodes 1005 is determined using the first plurality of capacitive measurements. For example, in one embodiment, processing system 110C determines which sensor electrodes will be in the second set (e.g., set 1060) of the first plurality of sensor electrodes 1005, by using the first plurality of capacitive measurements. This can facilitate disambiguation, which is described further below. For example, in one embodiment, if a capacitance measurement is indicative of the likely presence of an input object being measured by the first set of sensor electrodes; more overlapping sensor electrodes may be selected. While in another embodiment, if no input object is likely based on the first capacitance measurement, fewer or no overlapping sensor electrodes may be in the second set.

Some embodiments of device 1000 and method 1100, as well as other methods and devices described herein, use the ability to sense both absolute capacitance and transcapacitance to enable individual sensing schemes, to enable additional functionality, and/or for other purposes. Various techniques and reasons for utilizing these types of sensing in alternation or combination have been previously described herein, and more discussion appears below.

Use of Both Absolute and Transcapacitive Sensing by a Sensor Device

In many embodiments, the absolute capacitance sensing may enable sensing further away than does transcapacitive sensing. For example, some mobile phones may be enabled with capacitive sensors. Many of these mobile phones locate capacitive sensor electrodes close to each other, and close to one face (e.g., the front face) of the device. The batteries of the devices may be located close to an opposite face (e.g., the back face). The battery often supplies the system ground of the device, and can be considered a large electrical object to which the sensor electrodes may capacitively couple. Sometimes, part of the housing may be coupled to the system ground provided by the battery and the size of this large electrical object increases.

Driven in an "absolute capacitance sensing" method, significant field lines run between the sensor electrodes and the effective electrode supplied by the battery. The relatively large distance between the capacitive sensor electrodes and the battery/grounded housing enables capacitive sensing of objects relatively far away.

In contrast, driven in a "transcapacitive" method, significant electric field lines run between the transmitting and receiving sensor electrodes, and less so between the sensor electrodes and the effective electrode supplied by the battery. Given the relatively fewer field lines running into free space from the sensor electrodes (since most run between the sensor electrodes), the ability of these sensor electrodes to sense far away from the sensor electrodes is limited. Theoretically, it is still possible to sense as far as in the absolute capacitance case, since the electric field coupling transmitting and receiving sensor electrodes can still be affected by objects relatively far from the sensor electrodes. However, this may not be feasible for many embodiments due to limitations on the size and spacing of the electrodes. Practically, such effects by objects relatively far from the sensor electrodes may be so small that they are on the level of noise, or the costs of circuitry that can sense such small changes may be prohibitive, or the like.

Also, the transcapacitive sensing schemes may enable more independent measurements than absolute sensing in many embodiments. Measurements that are more independent provide more information about what is sensed, and these measurements may be used to increase sensor performance (e.g., sensor accuracy, etc.).

With appropriate transcapacitive sensor design, the number of transmitting and receiving combinations drives the number of measurements that can be taken with transcapacitive sensor systems. In comparison, with appropriate absolute sensor design, the number of sensor electrodes drives the number of measurements that can be taken with absolute capacitance systems. Thus, transcapacitive systems may generate more independent measurements with the same number of sensor channels than absolute capacitance systems. Embodiments in accordance with the present technology may provide for a combination absolute-trans system. A combination-sensing-scheme system may increase the number of sensor measurements obtainable by the sensor device for each of the sensor electrodes than either scheme used alone. Also, a combination system can utilize transcapacitive and absolute capacitance sensing schemes in detecting and responding to a same user input. Absolute capacitance measurements can provide information about the user input when it is relatively far away, and transcapacitive measurements can provide information about the user input when it is relatively close. These enable a system to respond to a wider set of user input types and locations.

As another example, both absolute and transcapacitive measurements can be used to derive information about the user input when it is relatively close. In some embodiments, absolute capacitance sensing may provide profile information, and transcapacitance sensing with the same sensor electrodes may provide imaging information. Using both types of measurements together can provide information unavailable with only one of the sensing schemes (e.g., type of input, size of input), a better determination of the location of input object(s), and the like. As another alternative, both absolute and transcapacitive measurements can be used to provide information about the user input when it is relatively far.

Absolute capacitance and transcapacitance sensing may be used in combination. For example, some embodiments may control system wake-up using measurements obtained in an absolute capacitive mode, and use a transcapacitive mode for other functionalities such as capacitive imaging. Some embodiments may use measurements obtained in an absolute capacitive mode to determine general user input location and transcapacitive sensing for higher resolution information about the user input. Some embodiments may use absolute capacitive coupling to model finger coupled noise, such as for testing purposes.

Some embodiments superimpose absolute capacitance and transcapacitance sensing. For example, a driven voltage system may have a series of sensor electrodes where each sensor electrode is measured while being modulated. In such a case, an absolute capacitance may be obtained (e.g., for profiles of one or more fingers) at the same time a transcapacitance is obtained (e.g., for full capacitive images or for partial capacitive images as needed to disambiguate the profiles).

In some embodiments, one measurement is taken, and then another measurement is taken after the phase has been shifted. This allows determination of the absolute and transcapacitance portions in many cases. For example, with proper phase shifting (such as to an opposite phase), one measurement may reflect the sum of the absolute capacitive coupling to the external object (and associated system ground) and the transcapacitive coupling to the guard electrode(s), while the other measurement may reflect the difference between the absolute capacitive coupling to the external object (and associated system ground) and the transcapacitive coupling to the guard electrode(s). Thus, some embodiments may have sensor electrodes with references that are modulated relative to each other, where those sensor electrodes are simultaneously both receiving and transmitting sensor electrodes. This may help optimize measurement power, increase signal to noise, and improve interference tolerance.

Disambiguation Using Transcapacitive Sensing

Figure 12:
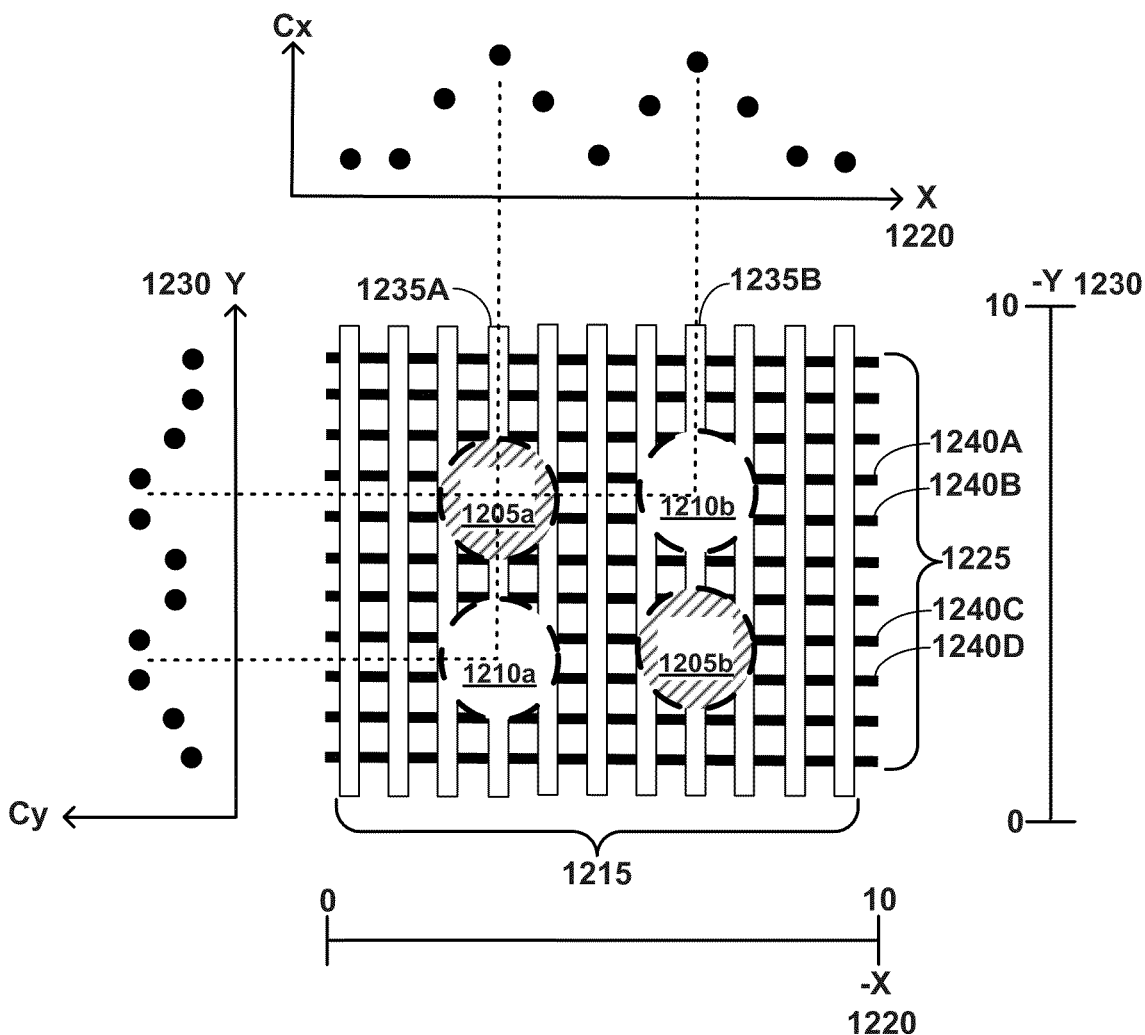
FIG. 12 shows potential ambiguity with profile-based position sensing method of disambiguating the configuration using transcapacitance sensing.

FIG. 12 shows a capacitance sensor device in accordance with embodiments of the present technology. Referring now to FIG. 12, the capacitance sensor devices 1200 and has a first set of sensor electrodes 1215 disposed along a first axis 1220 and a second set of sensor electrodes 1225 disposed along a second axis 1230. The two axes are shown as the X and Y axes of a Cartesian coordinate system, although other axes or coordinate systems may be used. Additionally, the sensor electrodes shown are long rectangles for simplicity of illustration and discussion. However, it is appreciated that many other shapes are suitable. The X and Y positions are further labeled for a range of X [0 . . . 10] and Y [0 . . . 10], although other ranges may be used.

Referring to FIG. 12, the illustrated sensor electrodes can be driven in an absolute sensing scheme, and used to produce separate one-dimensional (1D) profiles of changes in capacitive coupling. These 1D profiles can be thought of as silhouettes or projections of changes in capacitive coupling along the axes, and can be used to determine the position of an input object, such as input object 1205a and 1205b. For example device 1200 may determine positions, based upon the peaks of Cx and Cy.

FIG. 12 shows that pairs of input objects, 1205a and 1205b, and 1210a and 1210b, in different locations at different times, may produce the same 1D profiles. The capacitance sensor device 1200 has a first set of sensor electrodes 1215 disposed along a first axis 1220, and a second set of sensor electrodes 1225 disposed along a second axis 1230. Specifically, FIG. 12 shows a first pair of input objects 1205a and 1205b located at (3.0, 6.5) and (7.0, 2.5), respectively, and a second pair of input objects 1210a and 1210b located at (3.0, 2.5) and (7.0, 6.5), respectively. Either of the pairs may produce the profiles shown in FIG. 12. Thus, the positions of the input objects 1205a, 1205b, 1210a and 1210b may be ambiguous.

Depending on the circumstances (e.g., size of input objects, types of input objects, nearby noise, sensor resolution and accuracy, etc.), the number of input objects may also be ambiguous. For example, three input objects at three of the positions (3.0, 6.5), (7.0, 2.5), (3.0, 2.5), and (7.0, 6.5) may produce the same or similar profiles to those shown in FIG. 12. Similarly, four input objects at all four of the positions (3.0, 6.5), (7.0, 2.5), (3.0, 2.5), and (7.0, 6.5) may also produce the same or similar profiles.

Some embodiments of capacitive sensing devices described herein use the history of input object number and locations, relative magnitudes of the profile peaks or troughs, or other information to disambiguate. Some embodiments of capacitive sensing devices described herein introduce additional sensor electrodes or additional axes of sensor electrodes to disambiguate. However, these methods of disambiguation may not be completely conclusive or require additional electrodes.

To disambiguate in such instances, transcapacitance sensing may be used with at least a portion of the electrodes. For example, some systems may regularly shift from absolute capacitance sensing to transcapacitive sensing at regularly periods to help disambiguate. As another example, some systems may default to absolute capacitance sensing, and transition to transcapacitive sensing in response to ambiguity.

Transcapacitance sensing may be used to image parts of or entire sensing regions. For example, some systems may scan the entire sensing region and produce a 2D image of changes in capacitive coupling for an entire surface associated with the sensing region. The system may then use the image to ascertain the number of input objects and their locations. As another example, some systems may sense transcapacitance only in select portion(s) of the sensing region, such as in regions including or near potential input object locations. Such selective transcapacitance sensing may be achieved by transmitting and receiving on sensor electrodes that couple transcapacitively proximate to the potential locations of the input objects. This approach can produce a "partial image" sufficient to differentiate between true and false input object locations.

One method of disambiguating the situation shown in FIG. 12 using transcapacitive sensing is shown in accordance with embodiments of the present technology. In response to an ambiguous situation such as the one shown in FIG. 12, device 1200 may convert to sensing transcapacitance. Device 1200 may detect transcapacitance coupling between sensor electrodes that intersect near the potential locations of input objects. Input objects such as fingers may cause the greatest change in transcapacitive coupling at junctions near transmitting and receiving sensor electrodes. Thus, examining how transcapacitive coupling has changed from a baseline, or some other reference, may enable disambiguation of the position(s) or number(s) of input objects (or both).

In FIG. 12, in accordance with embodiments of the present technology, four horizontal sensor electrodes 1240a, 1240b, 1240c and 1240d are shown as transmitting and two vertical sensor electrodes 1235a and 1235b are shown as receiving in a disambiguation scan. It should be understood that the transmitting (and the receiving) may be done simultaneously or in sequence. It should also be understood that the numbers and status as transmitting and receiving sensor electrodes differ between designs and circumstances. For example, by observing that the capacitive couplings between sensor electrodes 1235a and 1240a, sensor electrodes 1235a and 1240b, sensor electrodes 1235b and 1240c and sensor electrodes 1235b and 1240d are reduced near input objects 1205a and 1205b, it is possible to disambiguate input objects 1205a and 1205b from 1210a and 1210b.

Some embodiments of the present technology comprise a capacitive imaging system with a series of sensor electrodes disposed over another series, in an overlapping manner. This configuration enables acquisition of a transcapacitive image of the user input. This configuration also enables sensing of far-field proximity input. For example, some sensor electrodes may operate as absolute capacitance sensor electrodes for sensing absolute capacitances, and as receiving sensor electrodes for sensing transcapacitances. As another example, some sensor electrodes may operate as shields or guards in an absolute capacitance sensing mode, and transmitting sensor electrodes in a transcapacitance sensing mode.

Figure 13:
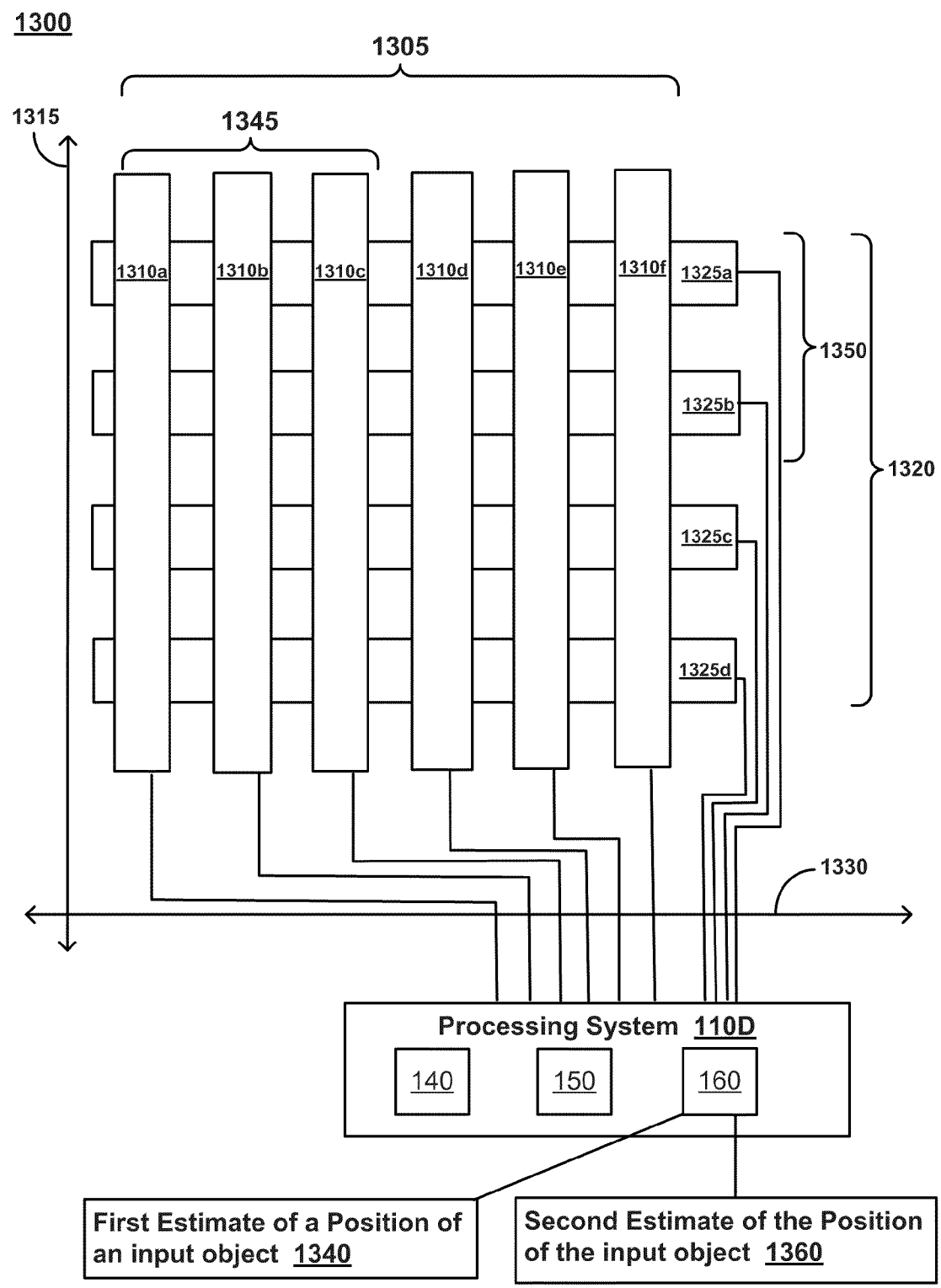
FIG. 13 is a block diagram of an example capacitive sensor device, in accordance with embodiments of the present technology.

Capacitive Sensor Device—Making Estimates of a Position of Input Objects Using First and Second Plurality of Capacitive Measurements Referring now to FIG. 13, a capacitive sensor device 1300 is shown in accordance with embodiments of the present technology. In one embodiment, capacitive sensor device 1300 comprises: a first plurality of sensor electrodes 1305 (shown as 1310a, 1310b, 1310c, 1310d, 1310e and 1310f in FIG. 13) that are aligned along a first axis 1315; a second plurality of sensor electrodes 1320 (shown as 1325a, 1325b, 1325c and 1325d in FIG. 13) that are aligned along a second axis 1330 which is non-parallel to the first axis 1315; and a processing system 110D which is coupled to the first plurality of sensor electrodes 1305 and the second plurality of sensor electrodes 1320. As is illustrated, the second plurality of sensor electrodes 1320 forms a matrix pattern with the first plurality of sensor electrodes 1305. Although all of the sensor electrodes in FIG. 13 are illustrated as being of similar size, this may not always be the case. For example, sensor electrodes 1320 may be of substantially greater surface area than sensor electrodes 1305. It is appreciated that processing system 110D includes similar features (sensor electrode controller 140, capacitive measurer 150, and determiner 160) that have been previously described in conjunction with processing system 110 (FIG. 1), processing system 110B (FIG. 8), and processing system 110C (FIG. 10).

In one embodiment, processing system 110D acquires a first plurality of capacitive measurements by selectively emitting and receiving first electrical signals using a first plurality of sensor electrodes (e.g., sensor electrodes 1305). It is appreciated that controller 140, in one embodiment, selects the sensor electrodes and controls the sensing and receiving, while capacitive measurer 150 performs capacitive measurements based up received signals. Processing system 110D then utilizes the first plurality of capacitive measurements to make a first estimate of a position 1340 of at least one input object using the first plurality of capacitive measurements. In one embodiment, determiner 160 of processing system 110D determines position estimates. The input object may be an object such a stylus, human digit, or writing utensil, and may comprise more than one (e.g., two or more input objects).

In one embodiment, processing system 110D select a first set 1345 (shown as 1310a, 1310b and 1310c in FIG. 13) of the first plurality of sensor electrodes 1305 and a first set 1350 (shown as 1325a and 1325b in FIG. 13) of the second plurality of sensor electrodes 1320 using the first estimate 1340 as a basis for the selection. For example, such a selection may be made in an embodiment where the first measurement indicated that an input object had been sensed relative to the upper left quadrant of the matrix formed by sensor electrodes 1305 and 1320. Processing system 110, then acquires a second plurality of capacitive measurements by emitting second electrical signals with one of the first sets 1345 and 1350 of the first 1305 and the second 1320 plurality of sensor electrodes, respectively, and by receiving the second electrical signals with another of the first sets 1345 and 1350 of the first 1305 and second 1320 plurality of sensor electrodes. Processing system 110D then makes a second estimate 1360 of the position of the at least one input object using the second plurality of capacitive measurements. In one embodiment, determiner 160 makes this second position estimate.

It is appreciated that the first plurality of capacitive measurements and the second plurality of capacitive measurements may be acquired by processing system 110D during first and second time periods, respectively. The first and second time periods may be the same, or different from one another. In one embodiment, where the first time period is different from the second time period, processing system 110D electrically guards the first plurality of sensor electrodes 1305 by modulating at least one sensor electrode of the second plurality of sensor electrodes 1320 with respect to a system ground during the first time period. Techniques for such modulation have been previously described herein.

In one embodiment, where two position estimates are made, the second position estimate 1360 is of finer resolution than the first estimate 1340. In one embodiment, where two position estimates are made, the first estimate 1340 comprises possible locations of the at least one input object, and the second estimate 1360 is a disambiguation of the possible locations. It is appreciated that one or more of the position estimates (1340, 1360) may be provided as an output from processing system 110D.

It is appreciated that, in one embodiment, processing system 110D is further configured to determine at least one of a size, a type, and a capacitive coupling to system ground of an input object using the first 1305 and second 1320 pluralities of capacitive measurements. One or more of these can additionally or alternatively be determined by determiner 160. A determined size, type, and/or capacitive coupling can be provided as an output from processing system 110D.

Example Method of Capacitive Sensing

Referring now to FIG. 14, a method 1400 of sensing using a capacitive sensor device such as capacitive sensor device 1300 is described, in accordance with one embodiment. As illustrated, capacitive sensor device 1300 comprises a first plurality of sensor electrodes 1305 aligned along a first axis 1315 and a second plurality of sensor electrodes 1320 aligned along a second axis 1330 that is non-parallel to the first axis 1315.

Referring now to 1405 of FIG. 14, in one embodiment, first electrical signals are emitted and received with a first plurality of sensor electrodes in order to acquire a first plurality of capacitive measurements. In one embodiment, this comprises controller 140 of processing system 110D providing one or more electrical signals and selecting a first plurality of sensor electrodes 1345 for emitting and receiving. Based upon the received electrical signals, in one embodiment, capacitive measurer 150 generates a plurality of capacitive measurements.

Referring now to 1410 of FIG. 14, in one embodiment, a set of first estimates of positions of at least one input object is made using the first plurality of capacitive measurements. It is appreciated that there may be two or more input objects for which estimates are made. In one embodiment, determiner 160 estimates the position(s) and provides the first set of estimates.

Referring now to 1415 of FIG. 14, in one embodiment, a first set of the first plurality of sensor electrodes and a first set of the second plurality of sensor electrodes is determined using the first set of estimates of the positions. Processing system 110D makes such a determination, in one embodiment, based on a potential location where an input object appears to have been sensed. In one embodiment, processing system 110D select a first set 1345 (shown as 1310a, 1310b and 1310c in FIG. 13) of the first plurality of sensor electrodes 1305 and a first set 1350 (shown as 1325a and 1325b in FIG. 13) of the second plurality of sensor electrodes 1320 using the first estimate 1340 as a basis for the selection. For example, such a selection may be made in an embodiment where the first measurement indicated that an input object had been sensed relative to the upper left quadrant of the matrix formed by sensor electrodes 1305 and 1320. Such a determination and selection of sets of sensor electrodes is made, in one embodiment, for purposes of disambiguation. Techniques for disambiguation have been previously described herein.

Referring now to 1420 of FIG. 14, in one embodiment, second electrical signals are emitted with one of the first sets of the first and second plurality of sensor electrodes and the second electrical signals are received with the other of the first sets of first and second plurality of sensor electrodes to acquire a second plurality of capacitive measurements. As previously describe, in one embodiment, processing system 110D provides the second electrical signals and selectively drives the signals and receives the signals. For example, in one embodiment, the second electrical signals are emitted using sensor electrodes 1345 or sensor electrodes 1350 and then received with the sensor electrodes of these which were not used for emitting.

Referring now to 1425 of FIG. 14, in one embodiment, a second estimate of the position of the at least one input object is made using the second plurality of capacitive measurements. As previously described, this can comprise determiner 160 of processing system 110D making this second estimate of position, which may be finer the first estimate of position. For example, the set of first estimates may comprises identifications of possible locations of the at least one input object, while the second estimate comprises a disambiguation of these possible locations.

Capacitive Sensor Device—Emitting and Receiving Electrical Signals to Acquire a First and Second Plurality of Capacitive Measurements Referring now to FIG. 15, a capacitive sensor device 1500 is shown in accordance with embodiments of the present technology. In one embodiment, capacitive sensor device 1500 comprises: a first plurality of sensor electrodes 1505 that are aligned along a first axis 1510; a second plurality of sensor electrodes 1515 that are aligned along a second axis 1520 which is non-parallel to said first axis; and a processing system 110E coupled to the first plurality of sensor electrodes 1505 and the second plurality of sensor electrodes 1515. As is illustrated, the second plurality of sensor electrodes 1515 forms a matrix pattern with the first plurality of sensor electrodes 1505. Although all of the sensor electrodes in FIG. 15 are illustrated as being of similar size, this may not always be the case. For example, as with FIG. 8, sensor electrodes 1515 may be of substantially greater surface area than sensor electrodes 1505. It is appreciated that processing system 110E includes similar features (sensor electrode controller 140, capacitive measurer 150, and determiner 160) that have been previously described in conjunction with processing system 110 (FIG. 1), processing system 110B (FIG. 8), processing system 110C (FIG. 10), and processing system 110D (FIG. 13).

In one embodiment, processing system 110E emit and receive first electrical signals with a first plurality of sensor electrodes 1505 during a first time period in order to acquire a first plurality of capacitive measurements. This may comprise controller 140 generating these first electrical signals and selecting the first plurality of electrodes 1505. Once the signals are received, capacitive measurer 150 determines a plurality of capacitive measurements. In one embodiment, processing system 110E electrically guards the first plurality of sensor electrodes 1505 by modulating the second plurality of sensor electrodes 1515 during the first time period. Examples of such electrical guarding have been previously described herein, such as in conjunction with description of FIG. 4. In one embodiment, processing system 110E emits second electrical signals with second plurality of sensor electrodes 1515 during a second time period that is different from the first time period. Processing system 110E then receives the second electrical signals with the first plurality of sensor electrodes 1505 during the second time period and uses the signals to acquire a second plurality of capacitive measurements.

In one embodiment, processing system 110E electrically guards the first plurality of sensor electrodes 1505 by modulating the second plurality of sensor electrodes 1515 during the first time period. This can comprise modulating substantially all of the second plurality sensor electrodes 1515 in a manner that is substantially similar to the modulation of at least one of the first plurality of sensor electrodes 1505 during the first time period. Again it is appreciated that such techniques have previously been described herein, in particular with discussion of FIG. 4.

In one embodiment, processing system 110E electrically guards the first plurality of sensor electrodes 1505 by modulating the second plurality of sensor electrodes 1515 during the first time period. This can comprise modulating a subset of the second plurality of sensor electrodes 1515 substantially similarly to an amplified version of a modulation of at least one the first plurality of sensor electrodes 1505 during the first time period.

In one embodiment, the processing system 110E emits second electrical signals with second plurality of sensor electrodes 1515 during a second time period that is different from the first time period. This can comprise emitting during different portions of the second time period using different sensor electrodes of the second plurality of sensor electrodes 1515. This can also comprise emitting differently modulated electrical signals using different sensor electrodes of the second plurality of sensor electrodes 1515 simultaneously for such emissions.

In one embodiment, the processing system 110E determines a position of an input object using at least one of the first and second pluralities of capacitive measurements. This can comprise determiner 160 making this position determination. Furthermore, in one embodiment, processing system 110E makes a first estimate 1540 using the first and second plurality of capacitive measurements and makes a second estimate 1545 using the first and second plurality of capacitive measurements. The first estimate 1540 is of a capacitive coupling between a first sensor electrode and an input object and the second estimate 1545 is of a capacitive coupling between the first sensor electrode and a second sensor electrode. Performance of such estimates has been previously described herein. In one embodiment, determiner 160 of processing system 110E also determines at least one of a size, type, and grounding of an input object using the first and second pluralities of capacitive measurements. It is appreciated that the estimates and determinations can be provided as outputs from processing system 110E.

Example Method of Capacitive Sensing

Figure 16:
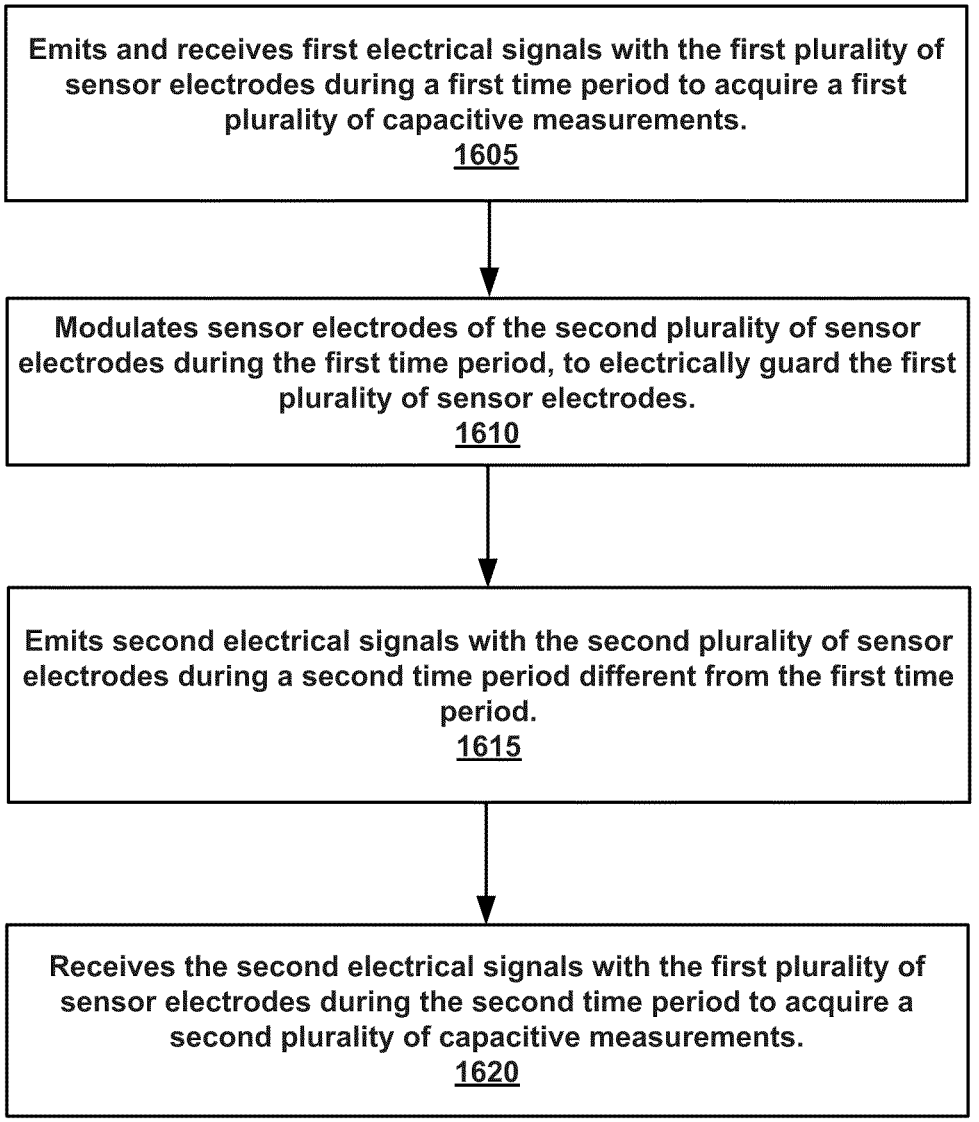
FIG. 16 is flowchart of an example method of sensing using a capacitive sensor device comprising a first plurality of sensor electrodes aligned along a first axis and a second plurality of sensor electrodes aligned along a second axis non-parallel to the first axis, in accordance with embodiments of the present technology.

Referring now to FIG. 16, a method 1600 of sensing using a capacitive sensor device 1500 is described, in accordance with one embodiment. As illustrated, capacitive sensor device 1500 comprises a first plurality of sensor electrodes 1505 that are aligned along a first axis 1510 and a second plurality of sensor electrodes 1515 that are aligned along a second axis 1520 that is non-parallel to first axis 1510.

Referring now to 1605, in one embodiment, first electrical signals are emitted and received with the first plurality of sensor electrodes during a first time period to acquire a first plurality of capacitive measurements. In one embodiment, this comprises controller 140 of processing system 110E providing one or more electrical signals and selecting a first plurality of sensor electrodes, such as sensor electrodes 1505, for emitting and receiving. Based upon the received electrical signals, in one embodiment, capacitive measurer 150 generates a plurality of capacitive measurements.

Referring now to 1610 of FIG. 16, in one embodiment, sensor electrodes of a second plurality of sensor electrodes are modulated during the first time period, to electrically guard the first plurality of sensor electrodes. In one embodiment, controller 140 provides these electrical signals to sensor electrodes 1515, which constitute the second plurality of sensor electrodes. In one embodiment, substantially all of the second plurality sensor electrodes 1515 are modulated substantially similarly to the modulation of at least one of the first plurality of sensor electrodes 1505 during the first time period. In another embodiment, a subset of the second plurality of sensor electrodes 1515 is modulated substantially similarly to an amplified version of a modulation of at least one the first plurality of sensor electrodes during the first time period.

Referring now to 1615 of FIG. 16, in one embodiment, second electrical signals are emitted with the second plurality of sensor electrodes during a second time period different from the first time period. In one embodiment, this comprises processing system 110E emitting the second electrical signals on sensor electrodes 1515.

Referring now to 1620 of FIG. 16, in one embodiment, die second electrical signals are received with the first plurality of sensor electrodes during the second time period to acquire a second plurality of capacitive measurements. In one embodiment, this comprises processing system 110E receiving the second electrical signals with sensor electrodes 1505 and the acquiring the capacitive measurements from the received signals.

In one embodiment, processing system 110E emits second electrical signals with the second plurality of sensor electrodes 1515 during a second time period that is different from the first time. This can comprise emitting non-concurrently during the second time period using different individual sensor electrodes of second plurality of sensor electrodes 1515. This can also comprise simultaneously emitting differently modulated electrical signals using different individual sensor electrodes of second plurality of sensor electrodes 1515.

In one embodiment, method 1600 further comprises determining a position of an input object using at least one of the first and second pluralities of capacitive measurements. As has been previously described, determiner 160 of processing system 110E, makes such position determinations (and other determinations such as size, type, and grounding determinations) from capacitive measurements.

Additionally, in one embodiment, method 1600 further comprises making a first estimate using the first and second capacitive measurements, and making a second estimate using the first and second capacitive measurements. The first estimate is of a capacitive coupling between the a sensor electrode of sensor electrodes 1505 and an input object, and the second estimate is of a capacitive coupling between this sensor electrode of sensor electrodes 1505 and a second sensor electrode of sensor electrodes 1515. Based upon these estimates, processing system 110E (determiner 160) determines at least one of a size, type, and grounding of an input object.

As has been described herein, in some embodiments, sensor electrodes may have functions such as guarding or shielding the sensor from electrical noise, mitigating sensitivity of the buttons to moisture, and the like. As has been described herein in conjunction with FIG. 4, these sensor electrodes may accomplish these functions with modulations different from those used for transcapacitance sensing.

Example "Button" Capacitive Sensing Devices

In some embodiments, a capacitive sensor device as described herein, includes a set of sensor electrodes configured to form discrete capacitive buttons. In many embodiments, the capacitive buttons are enabled by one sensor electrode configured to sense absolute capacitance per capacitive button (although that need not be the case). In such a design, the absolute capacitive coupling between an input object (e.g., a finger or stylus) and a button sensor electrode is driven predominantly by the area of overlap between the two. In some embodiments, the largest area of overlap, and thus the largest effect on the button, occurs when the input object is centered on the button sensor electrode.

The degree of absolute capacitive coupling provides enough information for some functions. However, more information about the user input may still be determined, or particular issues associated with absolute capacitance sensing may still be determined, for other functions. Examples of user input information include the size of the input object, the type of input object, improved location or motion estimates about the input object, information about the input object outside of the absolute capacitance sensing region, estimates of the off-centeredness of the input object, and the like. Examples of issues associated with absolute capacitance sensing may include sensitivity to moisture, and potential inability to distinguish between an input object sliding in from the side and the input object coming straight down from above. Sensing transcapacitance in addition to absolute capacitance may supply such information or resolve such issues.

In some embodiments, such transcapacitive sensing may be accomplished by modulating one or more other electrodes near the button sensor electrode. For example, in embodiments where a sensor device includes a sensor electrode used for absolute capacitive sensing near one or more other electrodes, changing the modulation of the other electrode(s) may enable transcapacitive sensing between the other electrode(s) and the sensor electrode. Changing the modulation may involve switching from not modulated to modulated, from modulated to not modulated, or from one modulation to another modulation (e.g., from guarding to transmitting). Where the modulation of the other electrode(s) differ from the button sensor electrode, the other electrode(s) effectively transmits signals to the button sensor electrode.

FIGS. 17A, 17B, 18A, 18B, 19A, 19B, 20A and 20B show a sensor device 1705 with a round "button" sensor electrode 1710 surrounded by a sensor electrode 1715. Cross sections BB' and CC', associated with FIGS. 17A and 18A, respectively, help define the placement for input object 1725 relative to an absolute capacitance sensing region 1730 and to input surface 1780. Referring now to 17A, during a first time period, button sensor electrode 1710 is modulated with respect to system ground (to which the input object 1725 is assumed to be capacitively coupled). Sensor electrode 1715 may be held at a voltage substantially constant with respect to system ground or modulated like button sensor electrode 1710. When modulated like button sensor electrode 1710, sensor electrode 1715 may provide an effective guard for button sensor electrode 1710. Substantially parallel field lines 1720 are generated that may interact with input object 1725 in absolute capacitance sensing region 1730. Changes in the absolute capacitive coupling due to input object 1725 are detected by "Sense" block 1735. There may be other guard or shield electrodes 1745 that are consistently driven by signals to help protect button sensor electrode 1710 from electrical noise such as, but not limited to, system ground or various guard signals 1745.

Figure 18A:
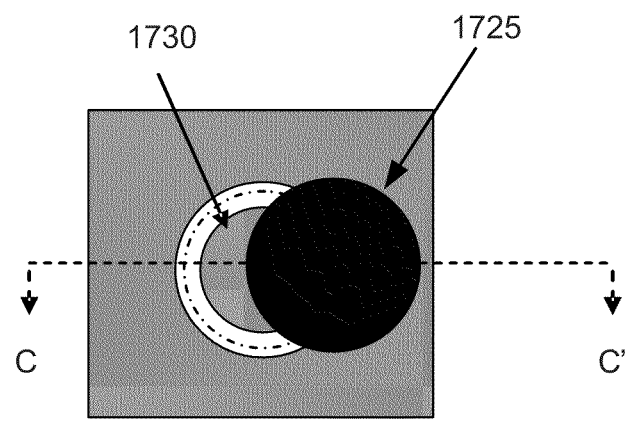
Figure 18B:
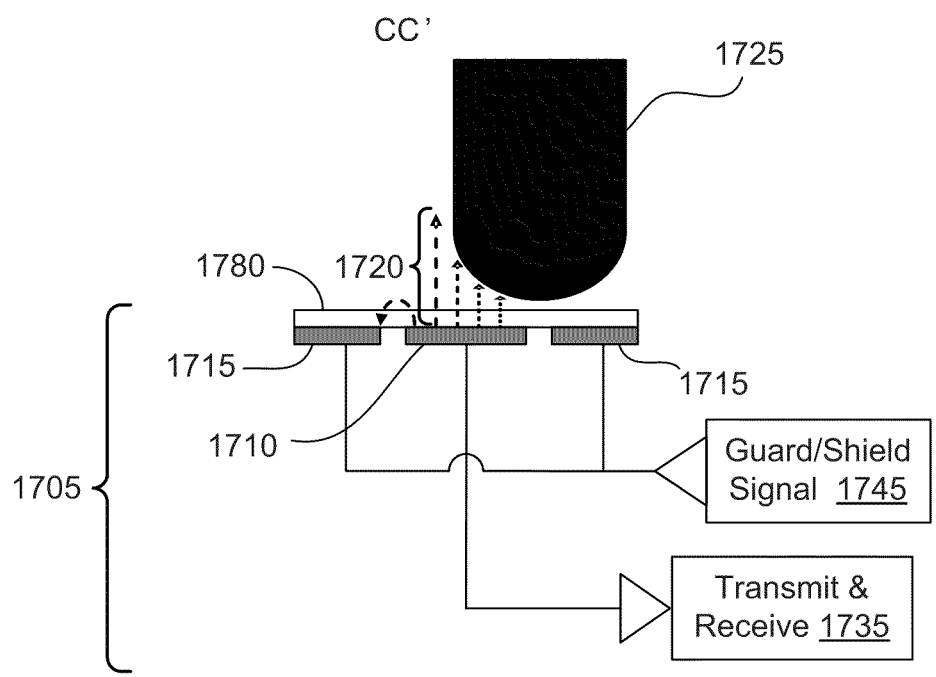
Figure 19A:
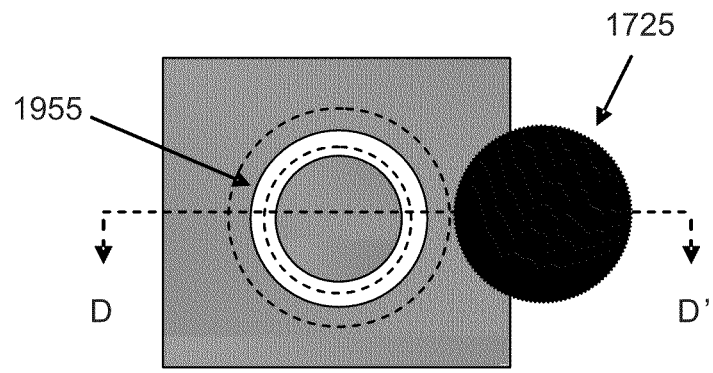
Figure 19B:
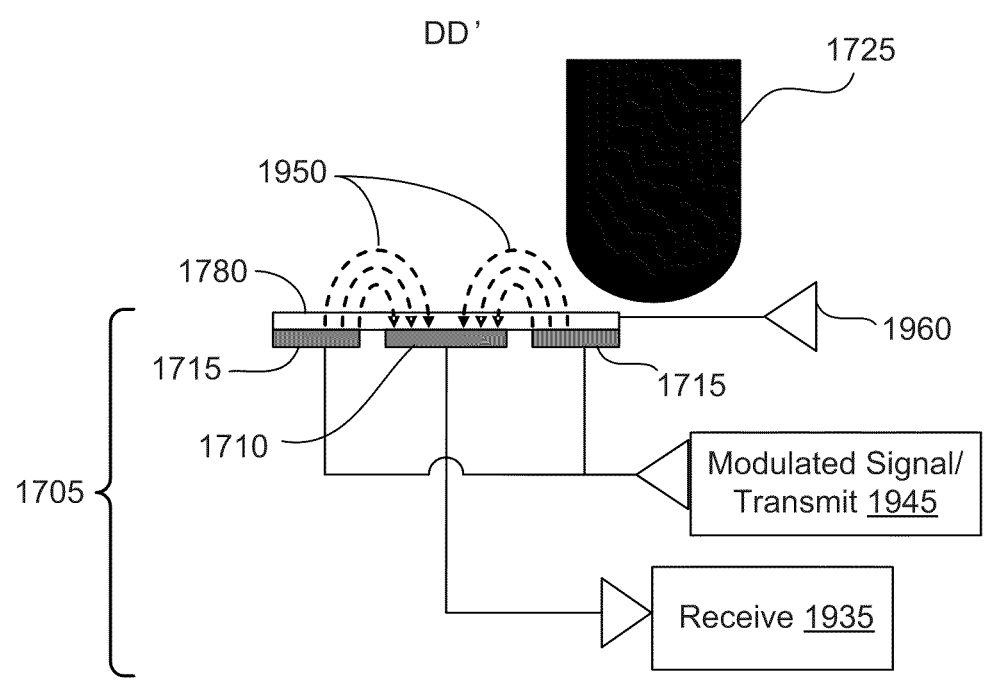
Figure 20A:
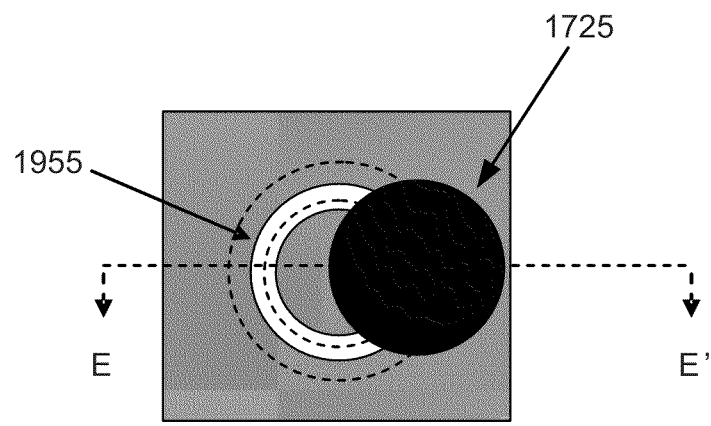
Figure 20B:
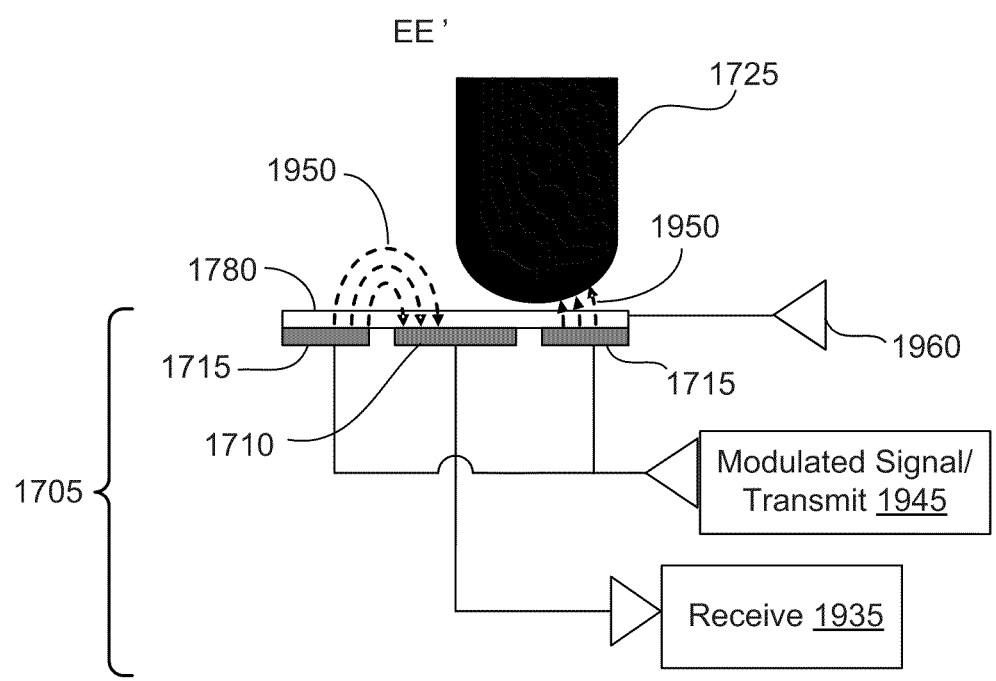

Referring now to FIGS. 18A and 18B, it is shown that as input object 1725 slides in towards absolute capacitance sensing region 1730, input object 1725 interacts with the substantially parallel field lines 1720 even before it is in position to substantially affect field lines 1710.

Referring now to FIGS. 19A, 19B, 20A and 20B, during a second time period, the button sensor electrode 1710 may be modulated in the same way as has been described in conjunction with FIGS. 17A, 17B, 18A and 18B during a first time period. For example, sensor electrode 1715 may be modulated with respect to system ground (and differently from the button sensor electrode 1710). Cross sections DD' and EE', associated with FIGS. 19A and 20A, respectively, help define the placement for input object 1725 relative to the transcapacitance sensing region 1955. Such a change in modulation of the sensor electrode 1715 enables transcapacitive measurements in an annular region around button sensor electrode 1710. Fringing field lines 1950 result and may be intercepted by an input object in transcapacitance sensing region 1955. Generally, the greatest amount of transcapacitive coupling may occur at the junction between button sensor electrode 1710 and sensor electrodes 1715. That is, the transcapacitive effect for such a configuration typically asymptotes substantially and "maxes out" where input object 1725 covers the entire junction. For many embodiments, this means that the junction is the region most transcapacitively sensitive to the influence of input object 1725. Changes in the transcapacitive coupling due to the input object may be detected by "Sense" block/region 1935. Any other guard or shield electrodes present may be driven by appropriate guard/shield and modulated signals, 1945 and 1960, respectively, to help protect button sensor electrode 1710 from electrical noise.

Referring now to 20A and 20B, it is shown that as input object 1725 slides in towards transcapacitance sensing region 1955, input object 1725 interacts with fringing field lines 1950.

Transcapacitive readings thus may be used in combination with absolute capacitance measurements obtained using button sensor electrode 1710 to provide more information about the user input, such as types, sizes, and motions of input objects. For example, combining such measurements may enable differentiation of input objects moving toward the button sensor electrode 1710 by sliding sideways versus descending from above. Similarly, combining such measurements may enable differentiation of input objects moving away from button sensor electrode 1710 by sliding outwards versus lifting off. Below, a more detailed discussion follows.

Figure 17A:
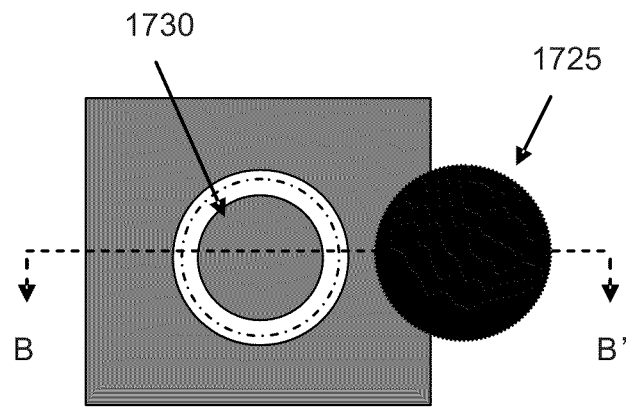
FIGS. 17A, 17B, 18A, 18B, 19A, 19B, 20A and 20B show embodiments of the present technology that are capable of measuring both absolute and trans-capacitance to resolve two regions, in accordance with the present technology.
Figure 17B:
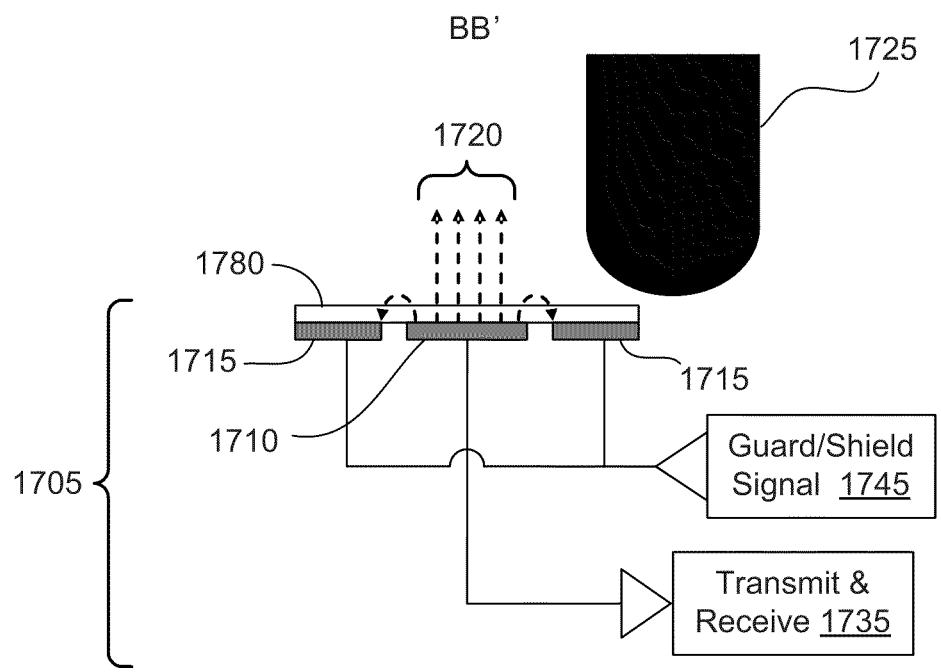

For a system such as shown in FIGS. 17A and 17B, an absolute measurement generally does not enable disambiguation between an input object dropping in toward button sensor electrode 1710 from above and an input object sliding in from the side to cover more of button sensor electrode 1710. Having both absolute capacitance and transcapacitance measurements enable this differentiation. For example, if the input object is a finger, and if the finger is dropping in on button sensor electrode 1710 from above, changes in absolute and transcapacitive coupling largely changes simultaneously. However, if the finger is sliding in from the side, changes in transcapacitance generally occur before changes in absolute capacitance (since the finger interacts with area outside the edge of the button electrode before it interacts with the button electrode).

Thus, it should be understood that comparing the transcapacitive coupling reading to the absolute capacitive coupling reading may enable determination of extra information about the input. For example, determining size enables checking for input that is larger than input objects can be (e.g., part of a face such as a cheek, instead of a finger) and an appropriate response (e.g., rejection of the input) rather than activation.

For embodiments where absolute capacitance sensor electrodes are already near other electrodes (e.g., electrodes used for shielding or for some other purpose), new physical electrodes to enable the transcapacitive sensing may not be added. One or more of these other electrodes may be controlled separately with one or more different signals. For example, a guard electrode driven by a consistent guard signal 1745 may be modulated differently in some time periods to provide transcapacitive sensing capability.

Where the plane electrode is modulated differently from button sensor electrode 1710 and the input object, then the input object's effect may be combined with the plane electrode's effect. In a simple case, the combination can be additive. In more complex cases, the combination may involve much more than superposition. This combination can be resolved, and absolute capacitance and transcapacitive components derived, if two or more non-degenerate measurements are taken. Two measurements are non-degenerate when they are not mathematical multiples of each other (e.g., the modulation amplitudes associated with the two measurements are not just multiples or fractions of each other). For example, assuming other changes are insignificant, changing the modulation of sensor electrode 1715 from being the same as button sensor electrode 1710 to being different from button sensor electrode 1710 produces two non-degenerate measurements.

Different modulations of a sensor electrode, such as sensor electrode 1715, may be achieved in many ways. For example, a system can alternate between grounding sensor electrode 1715 in a first time period and modulating sensor electrode 1715 within the sample bandwidth of sensor electrode 1715 in a second time period. Output from sensor electrode 1715 can be demodulated and averaged by device 1705 to provide an absolute capacitance reading for the first time period and/or a transcapacitive reading for the second time period. The previous example involves switching between the voltage on sensor electrode 1715 from being substantially constant, with respect to system ground to one modulated with respect to system ground. Some techniques for accomplishing such modulation have been previously described in conjunction with FIG. 4. It should also be understood that two or more different modulation signals may be used instead. Further, the signals may modulate electrical aspects other than voltage.

The absolute capacitance and transcapacitance measurements may be taken in any appropriate order, and over any appropriate periods of time. For example, the first time period may take place before or after the second time period. Some embodiments may take measurements of absolute capacitance and transcapacitance in quick succession (quick relative to the movement of the input device), and then demodulate them. Some embodiments may take multiple absolute capacitance measurements, then multiple transcapacitance measurements, and use averages or filtered versions of them. Some embodiments may take a first combination of absolute and transcapacitance measurements in a first time period, and a second combination of absolute and transcapacitance measurements in a second time period. Some embodiments may take alternating absolute capacitance and transcapacitance measurements, and still use averages or filtered versions of them. In many embodiments, all of this can be accomplished within a reasonable touch time-span for sensing finger-type input and providing information to typical computer devices (e.g., approximately 1/60 of a second).

In many embodiments for sensing human finger interactions, readings are taken at 10 Hz or faster. Many embodiments take readings at tens of hertz, hundreds of hertz, or thousands of hertz. Where the changes in measurements are expected to be slower (e.g., where distances to the input object increases), the measurement sampling rate may be slower. Conversely, where the changes in measurements are expected to be faster (e.g., where distances to the input object is less), the measurement sampling rate may be faster. In many embodiments, the distance from the sensor electrodes to the input object is at least 1 mm, since at least 1 mm of housing, cover layer, or other material separates the sensor electrodes from the input object.

Many embodiments may include a proximity sensor configured to sense both absolute capacitance and transcapacitance. This proximity sensor may be configured to sense longer ranges (e.g., detect input objects relatively further away). This proximity sensor may comprise a first sensor electrode, a second sensor electrode, and a processing system coupled to the first and second sensor electrode (arrangements shown in and discussed in conjunction with FIG. 8, FIG. 10, FIG. 13, FIG. 15, and FIGS. 17-20 may be configured to operate in a proximity sensing manner). For purposes of example, the method of operation below is described either genetically or with else briefly with respect to features of device 800 of FIG. 8. However, it appreciated that this method of operating could be applied to any of the sensing devices described herein. In such a device, the first and second sensor electrodes (e.g., 805 and 810) are configured to couple capacitively with an external object such. A processing system (e.g., processing system 110B) of the device obtains a first measurement indicative at least in part of the capacitance coupling of the first sensor electrode with the external object and a second measurement indicative at least in part of the capacitance coupling of the first sensor electrode with the second sensor electrode. In one embodiment, the first and second measurements are not degenerate (e.g., the voltages applied for the first measurement are not all changed by the same offset for the second measurement). This device detects a direct influence of the external object on the capacitive coupling between the first and second sensor electrodes (e.g., by intercepting electric field lines that would have coupled the sensor electrodes), and not an indirect influence of the external object moving the first and second sensor electrodes together.

The first and second measurements may be taken by the processing system in relatively close in time (e.g., such that changes in capacitive coupling due to movement of the external object or other changes in the environment are negligible for the desired accuracy and resolution). In many embodiments, the processing system takes at least one of the first and second measurements with the second sensor electrode acting as a receiving sensor electrode that is modulated relative to device/system ground. The processing system may also estimate, using at least the first and second measurements, at least one of a capacitive coupling the first and second sensor electrodes and a capacitive coupling between the second sensor electrode and the external object.

Figure 21:
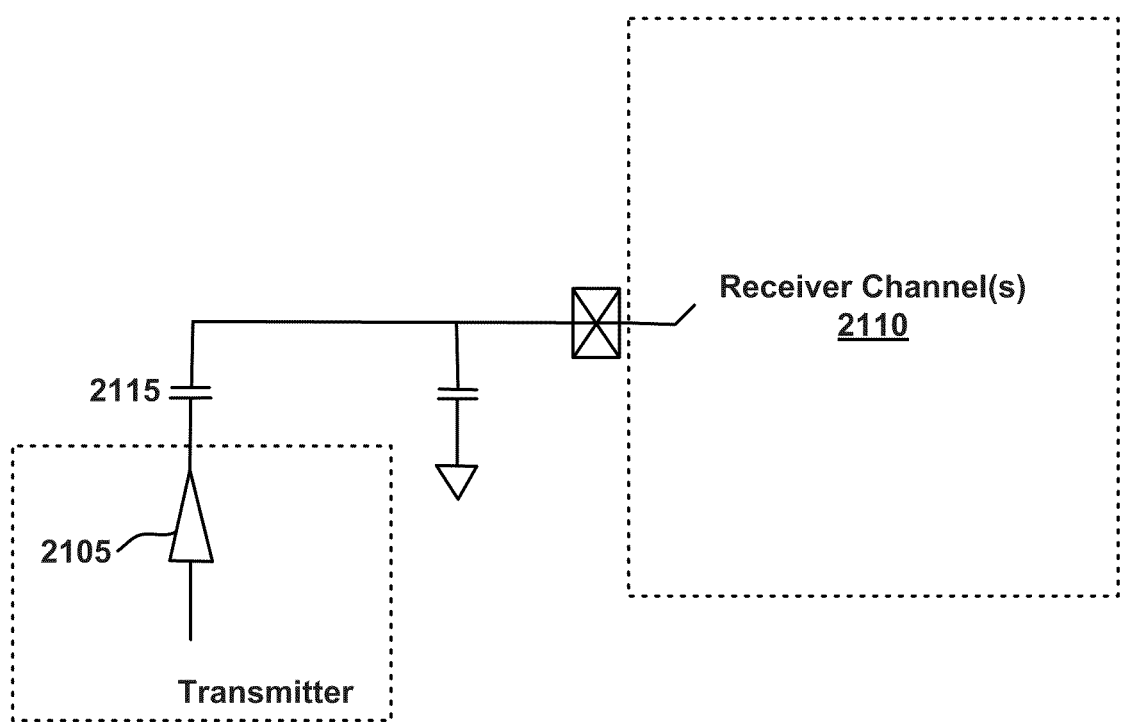
FIG. 21 shows a conceptual diagram for a transcapacitive image integrated circuit in accordance with embodiments of the present technology.

Referring now to FIG. 21, a conceptual diagram for a transcapacitive image integrated circuit 2100 is shown in accordance with embodiments of the present technology. FIG. 21 illustrates an embodiment of a transcapacitive mode of operation. As shown in FIG. 21, one transmitter 2105 drives a row sensor electrode and multiple receivers can then detect on multiple sensor electrode columns. In this configuration, each receiver channel 2110 senses mainly one transcapacitance 2115 between the driven row and its own column.

Figure 22:
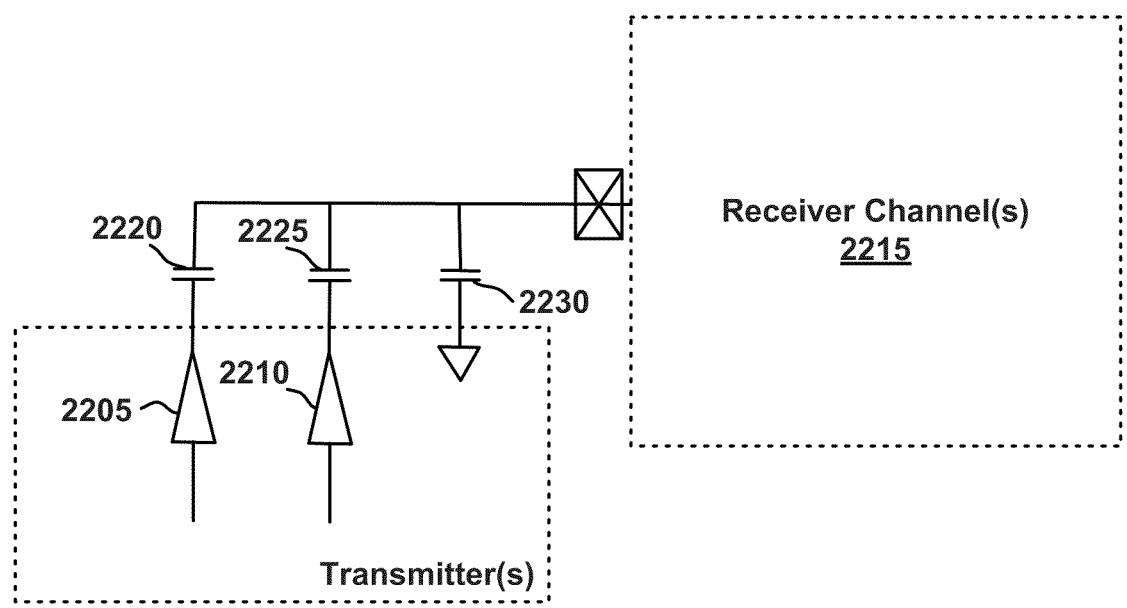
FIG. 22 shows a conceptual diagram for an absolute image integrated circuit, in accordance with embodiments of the present technology.

Referring now to FIG. 22, a conceptual diagram for an absolute image integrated circuit 2200 is shown in accordance with embodiments of the present technology. FIG. 22 illustrates an absolute mode of operation in accordance with embodiments of the present technology. As shown in FIG. 22, multiple transmitters 2205 and 2210 drive on multiple individual rows and multiple receivers detect on multiple individual columns. In this configuration, each receiver channel 2215 senses mainly the total capacitance (capacitor 2225–capacitor 2220+capacitor 2230) between the driven row and its own column. In FIG. 22, capacitance 2220 is the total transcapacitance of all in phase driving transmitters and capacitance 2225 is the total transcapacitance of all non-driving transmitters. The non-driven transmitters may be held substantially to ground (or a constant voltage). In other embodiments, the phase of some transmitter sensor electrodes can be inverted.

Switching between absolute capacitance sensing mode and transcapacitive sensing mode is not limited to controlling when a touch sensor returns to sleep or stays awake. Starting with an absolute capacitance sensing mode and switching to a transcapacitive sensing mode when certain criteria have been met may be used in other applications. Examples of other application include cases where an initial assessment of the environment proximate to the touch sensor, or an initial assessment of touch sensor functionality, or the like is performed before full imaging. In some embodiments, this approach is used where time constraints mean that there is not enough time to do a full image scan.

Capacitive Sensor Device—Example Circuitry

Figure 23:
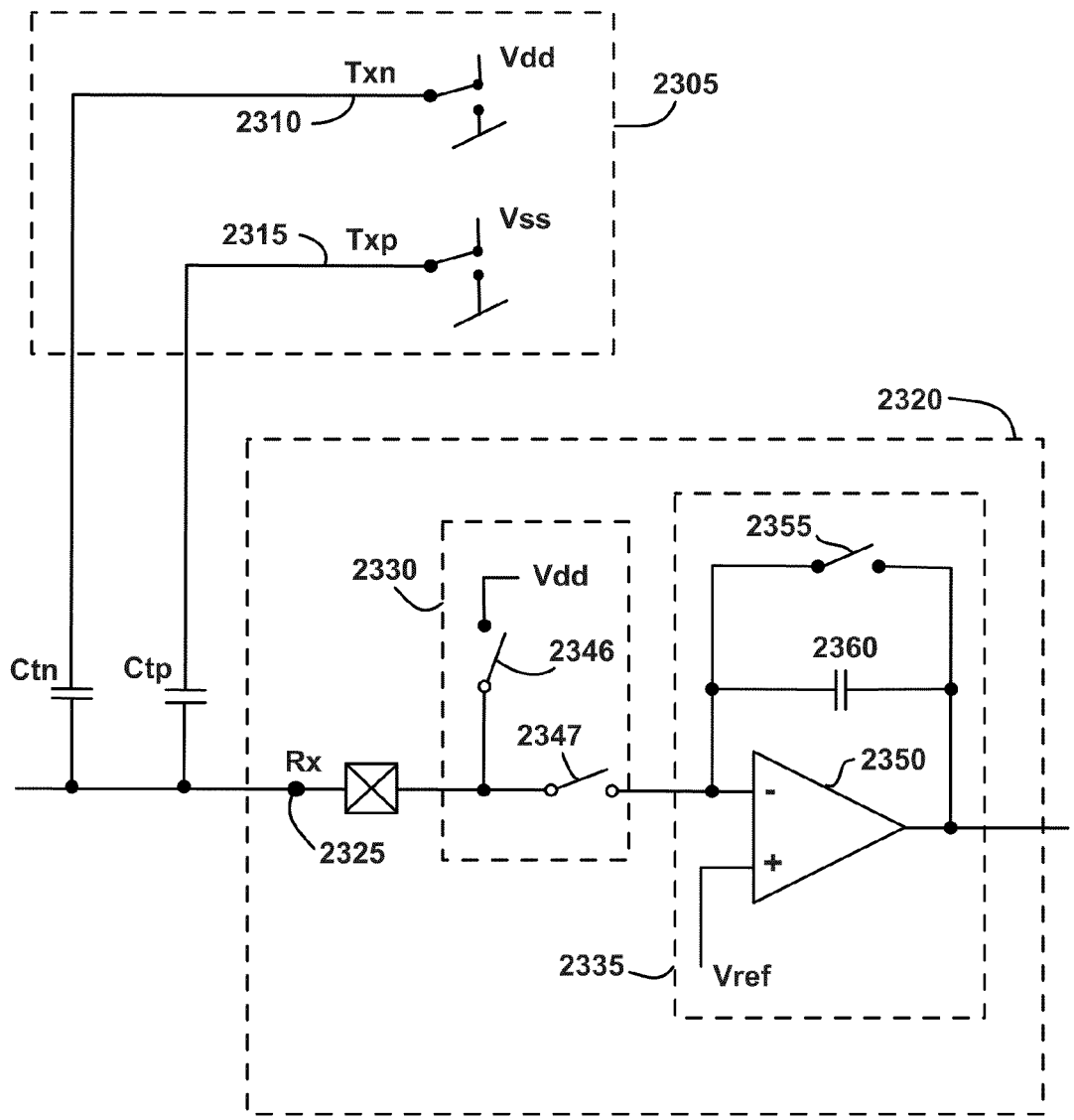
FIG. 23 is a block diagram of an example capacitive sensor device, in accordance with embodiments of the present technology.

Referring now to FIG. 23, a capacitive sensor device 2300 is shown in accordance with embodiments of the present technology. Capacitive sensor device 2300 comprises: a transmitting assembly 2305, a receiving assembly 2320, a switching mechanism 2330, and a charge measurement mechanism 2335. Capacitive sensor device 2300 is configured for use with both absolute and transcapacitive measurements.

As illustrated, transmitting assembly 2305 includes a plurality of transmitting sensor electrodes 2310 and 2315 and receiving assembly 2320 includes at least one receiving sensor electrode 2325. Switching mechanism 2330 charges the receiving sensor electrodes (e.g., 2325) to a charged voltage. Charge measurement mechanism 2335 is, in one embodiment, an operational amplifier 2350 that measures controls through feedback the charged voltage applied to the inverting input of operational amplifier 2350 by using a reference voltage Vref as an input on the non-inverting input of operational amplifier 2350. It is appreciated that reference voltage Vref has a substantially constant voltage. In one embodiment, capacitive sensor device 2300 further comprises a supply voltage, and reference voltage Vref is proportional to the supply voltage.

In one embodiment, the plurality of transmitting sensor electrodes 2310 and 2315 is coupled with at least two electric potentials Vdd and Vss, respectively, via a plurality of switches.

In one embodiment, switching mechanism 2330 comprises at least two switches 2346 and 2347. In one embodiment, switch 2346 couples die receiving sensor electrode(s) (e.g., sensor electrode 2325) with a first electric potential Vdd during a first time period. In one embodiment, switch 2347 couples receiving sensor electrode(s) (e.g., sensor electrode 2325) with charge measurement mechanism 2335 during a second time period. Furthermore, in one embodiment, a third switch (not illustrated) of switching mechanism 2330 can couple the receiving sensor electrodes with a second electric potential.

In one embodiment, charge measurement mechanism 2335 of capacitive sensor device 2300, includes: amplifier 2350, a reset 2355, and an integrating feedback capacitance 2360. Feedback capacitance 2360 is coupled with amplifier 2350 and accumulates charge relative to reference voltage Vref. Charge measurement mechanism 2335 uses amplifier 2350 to control a charge on integrating feedback capacitance 2360 based at least in part on reference voltage Vref, which is coupled with the non-inverting input of amplifier 2350. Reset 2355 may comprise resistor or a switch (illustrated). In some embodiments the Reset 2355 may be a partial reset or other appropriate methods. In other embodiments, feedback capacitance 2360 may comprise multiple separately inverted (e.g., switched) capacitances.

In one embodiment, a first set of the plurality of transmitting sensor electrodes (2310 and 2315) are used to emit a guard signal. A variety of guard signals have been discussed herein and reference is made at least to the discussion of guard signals that appears in conjunction with FIG. 4. In particular the modulation of transmitting sensor electrodes 2310 and 2315 may serve to minimize the required charge transfer through feedback capacitance 2360. Furthermore, capacitive sensor device 2300 comprises a capacitive coupling component that performs at least two of the following: 1) capacitively couple at least one receiving sensor electrode and an input object, where the at least one receiving sensor electrode (e.g., receiving sensor electrode 2325) is modulated with respect to system ground while concurrently at least one transmitting sensor electrode of the plurality of transmitting sensor electrodes 2310 and 2315 electrically guards the at least one receiving sensor electrode 2325; 2) capacitively couple at least one transmitting sensor electrode (2310 or 2315) and the at least one receiving sensor electrode 2325, where the at least one transmitting sensor electrode (2310 or 2315) is modulated with respect to the at least one receiving sensor electrode 2325 while concurrently the receiving sensor electrode 2325 is not being modulated; 3) capacitively couple the at least one receiving sensor electrode 2325 and the input object and capacitively couple the at least one receiving sensor electrode 2325 and the at least one transmitting sensor electrode of the plurality of transmitting sensor electrodes 2310 and 2315, where the at least one receiving sensor electrode 2325 is modulated in a first way with respect to the system ground while concurrently the at least one transmitting sensor electrode of the plurality of transmitting sensor electrodes 2310 and 2315 is being modulated with respect to the at least one receiving electrode 2325 in a first way; and 4) capacitively couple the at least one receiving sensor electrode 2325 and the input object and capacitively couple the at least one receiving sensor electrode 2325 and the at least one transmitting sensor electrode of the plurality of transmitting sensor electrodes 2310 and 2315, where the at least one receiving sensor electrode 2325 is modulated with respect to the system ground while concurrently the at least one transmitting sensor electrode of the plurality of transmitting sensor electrodes 2310 and 2315 is modulated with respect to the at least one receiving sensor electrode 2325 in a second way.

Furthermore, in one embodiment, the at least one transmitting sensor electrode of the plurality of transmitting sensor electrodes 2310 and 2315 electrically guards the at least one receiving sensor electrode 2325. For example, at least one transmitting sensor electrode of the plurality of transmitting sensor electrodes 2310 and 2315 is driven with a constant voltage potential and one or more transmitting sensor electrodes of the plurality of transmitting sensor electrodes 2310 and 2315 other than the at least one transmitting sensor electrode is alternately driven between two electric potentials.

Moreover, in one embodiment, the at least one receiving sensor electrode 2325 is modulated with respect to the system ground while concurrently the at least one transmitting sensor electrode of the plurality of transmitting sensor electrodes 2310 and 2315 is being modulated with respect to the at least one receiving electrode 2325 in a first way that comprises at least one of the following: 1) the at least one transmitting sensor electrode of the plurality of transmitting sensor electrodes 2310 and 2315 is driven in an opposite polarity to the at least one receiving sensor electrode 2325; and 2) the at least one transmitting sensor electrode of the plurality of transmitting sensor electrodes 2310 and 2315 and the at least one receiving sensor electrode 2325 is driven with different amplitudes.

In one embodiment, the at least one receiving sensor electrode 2325 is modulated with respect to the system ground while concurrently the at least one transmitting sensor electrode of the plurality of transmitting sensor electrodes 2310 and 2315 is being modulated with respect to the at least one receiving electrode 2325 in a second way comprises at least one of the following: 1) the at least one transmitting sensor electrode of the plurality of transmitting sensor electrodes 2310 and 2315 is driven in an opposite polarity to the at least one receiving sensor electrode 2325; and 2) the at least one transmitting sensor electrode of the plurality of transmitting sensor electrodes 2310 and 2315 and the at least one receiving sensor electrode 2325 are driven with different amplitudes.

In one embodiment, the at least one receiving sensor electrode 2325 comprises two sensor electrodes: a first receiving sensor electrode and a second receiving sensor electrode, where the input switch 2347 is a multiplexer configured for allowing the first receiving sensor electrode and the second sensor electrode to be coupled in turn with charge measurement mechanism 2335.

Referring still to FIG. 23, in one embodiment, capacitive sensing device 2300 comprises a transmitting assembly 2305 that includes a plurality of transmitting sensor electrodes that are coupled with at least two electric potentials (e.g., Vdd and Vss), respectively, via a plurality of switches. Capacitive sensing device 2300 further comprises a receiving assembly 2320 that includes at least one receiving sensor electrode 2325; a switching mechanism 2330 that charges the at least one receiving sensor electrode to a charged voltage; and a charge measurement mechanism that controls the charged voltage applied to an input of an amplifier 2350 of the charge measurement mechanism by feedback on a substantially constant reference voltage Vref. Vref may be proportional to a supply voltage. In one such embodiment, charge measurement mechanism 2335 comprises an amplifier 2350; a reset 2355; and an integrating feedback capacitance 2360. The integrating feedback capacitance 2360 is coupled with the amplifier 2350 and acts to accumulate charge relative to reference voltage Vref. Charge measurement mechanism 2335 uses amplifier 2350 to control a charge on integrating feedback capacitance 2360 based at least in part on the reference voltage Vref. Reset 2355 may comprise resistor or a switch (illustrated). Capacitive sensor device 2300 can be used, in accordance with the techniques described herein for both absolute and transcapacitive measurements.

In one embodiment, switching mechanism 2330 comprises at least two switches 2346 and 2347. A first switch 2346 couples the at least one receiving sensor electrode 2325 with a first electric potential during a first time period and a second switch couples the at least one receiving sensor electrode 2325 with charge measurement mechanism 2335 during a second time period. Furthermore, a third switch (not illustrated) of switching mechanism 2330 couples the at least one receiver sensor electrode 2325 with a second electric potential.

What is claimed is:

1. A capacitive sensor device comprising:
a first sensor electrode;
a second sensor electrode; and
a processing system coupled to said first sensor electrode and said second sensor electrode, said processing system configured to:
acquire a first capacitive measurement by emitting and receiving a first electrical signal with said first sensor electrode,
acquire a second capacitive measurement by emitting and receiving a second electrical signal, wherein one of said first and second sensor electrodes performs said emitting and the other of said first and second sensor electrodes performs said receiving, wherein said first and second capacitive measurements are non-degenerate, and
determine first positional information using said first and second capacitive measurements.

2. The capacitive sensor device of claim 1, wherein said processing system is configured to determine first positional information using said first and second capacitive measurements by:
making an estimate using said first and second capacitive measurements, wherein said estimate is of a capacitive coupling between said first sensor electrode and one of an input object and said second sensor electrode and wherein said first positional information is based at least in part on said estimate of said capacitive coupling.

3. The capacitive sensor device of claim 2, wherein said capacitive coupling is between said first sensor electrode and said input object, and wherein said processing system is further configured to:
make a second estimate using said first and second capacitive measurements, wherein said second estimate is of a capacitive coupling between said first sensor electrode and said second sensor electrode.

4. The capacitive sensor device of claim 1, wherein said processing system is further configured to:
determine at least one of a size and type of said input object using said first and second capacitive measurements.

5. The capacitive sensor device of claim 1, wherein said processing system is configured to acquire said first capacitive measurement during a first time period and to acquire said second capacitive measurement during a second time period different from said first time period.

6. The capacitive sensor device of claim 5, wherein said second sensor electrode is said one of said first and second sensor electrodes that performs said emitting during said second time period, and wherein said processing system is further configured to:
modulate said second sensor electrode with respect to a system ground during said first time period, such that said second sensor electrode electrically guards said first sensor electrode.

7. The capacitive sensor device of claim 6, wherein said processing system is configured to modulate said second sensor electrode with respect to a system ground during said first time period by:
modulating said second sensor electrode substantially similarly to said first sensor electrode during said first time period.

8. The capacitive sensor device of claim 1, wherein said first sensor electrode is said one of said first and second sensor electrodes that performs said emitting, and wherein said processing system is configured to acquire said first and said second capacitive measurements contemporaneously.

9. The capacitive sensor device of claim 1, wherein said second sensor electrode is said one of said first and second sensor electrodes that performs said emitting, and wherein a surface area of said second sensor electrode is substantially greater than a surface area of said first sensor electrode.

10. The capacitive sensor device of claim 1, wherein said first sensor electrode is aligned along a first axis and said second sensor electrode is aligned along a second axis nonparallel to said first axis.

11. The capacitive sensor device of claim 1, further comprising:
a third sensor electrode coupled to said processing system; and
a fourth sensor electrode coupled to said processing system, wherein said processing system is further configured to:
acquire a third capacitive measurement by emitting and receiving a third electrical signal with said third sensor electrode,
acquire a fourth capacitive measurement by emitting and receiving a fourth electrical signal, wherein one of said third and fourth sensor electrodes performs said emitting and the other of said third and fourth sensor electrodes performs said receiving, wherein said third and fourth capacitive measurement are non-degenerate, and
determine second positional information using said third and fourth capacitive measurements.

12. A method of determining positional information using a capacitive sensor device comprising a first sensor electrode and a second sensor electrode, said method comprising:
emitting and receiving a first electrical signal with said first sensor electrode to acquire a first capacitive measurement;
emitting and receiving a second electrical signal to acquire a second capacitive measurement, wherein one of said first and second sensor electrodes performs said emitting and the other of said first and second sensor electrodes performs said receiving, and wherein said first and second capacitive measurements are non-degenerate; and
determining positional information using said first and second capacitive measurements.

13. The method of claim 12, wherein positional information comprises:
at least one of a position, size, and type of an input object.

14. The method of claim 12, wherein said emitting and receiving a first electrical signal with said first sensor electrode to acquire a first capacitive measurement occurs during a first time period, and wherein said emitting and receiving a second electrical signal to acquire a second capacitive measurement occurs during a second time period different from said first time period.

15. The method of claim 14, wherein said second sensor electrode is said one of said first and second sensor electrodes that performs said emitting during said second time period, said method further comprising:
    modulating said second sensor electrode with respect to a system ground during said first time period, such that said second sensor electrode electrically guards said first sensor electrode.

16. The method of claim 15, wherein said modulating said second sensor electrode with respect to a system ground during said first time period comprises:
    modulating said second sensor electrode substantially similarly to said first sensor electrode during said first time period.

17. The method as recited in claim 12, wherein said determining positional information using said first and second capacitive measurements comprises:
    making an estimate using said first and second capacitive measurements, wherein said estimate is of a capacitive coupling between said first sensor electrode and one of an input object and said second sensor electrode and wherein said positional information is based at least in part on said estimate of said capacitive coupling.

18. The method as recited in claim 17, wherein said capacitive coupling is between said first sensor electrode and said input object, and wherein said method further comprises:
    making a second estimate using said first and second capacitive measurements, wherein said second estimate is of a capacitive coupling between said first sensor electrode and said second sensor electrode.

19. The method as recited in claim 12, wherein said emitting and receiving a second electrical signal to acquire a second capacitive measurement comprises:
    emitting said second electrical signal with said first sensor electrode to acquire said second capacitive measurement contemporaneously with said acquiring of said first capacitive measurement.

20. The method as recited in claim 12, wherein said capacitive sensor device comprises a third sensor electrode and a fourth sensor electrode and wherein said method further comprises:
    acquiring a third capacitive measurement by emitting and receiving a third electrical signal with a third sensor electrode of said capacitive sensor device;
    acquiring a fourth capacitive measurement by emitting and receiving a fourth electrical signal, wherein one of said third sensor electrode and a fourth sensor electrode performs said emitting and the other of said third and fourth sensor electrodes performs said receiving, wherein said third and fourth capacitive measurement are non-degenerate; and
    determining second positional information using said third and fourth capacitive measurements.

* * * * *